(12) United States Patent
Chowdhury et al.

(10) Patent No.: US 9,520,491 B2
(45) Date of Patent: Dec. 13, 2016

(54) ELECTRODES FOR SEMICONDUCTOR DEVICES AND METHODS OF FORMING THE SAME

(71) Applicant: Transphorm Inc., Goleta, CA (US)

(72) Inventors: Srabanti Chowdhury, Goleta, CA (US); Umesh Mishra, Montecito, CA (US); Yuvaraj Dora, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/920,059

(22) Filed: Oct. 22, 2015

(65) Prior Publication Data

US 2016/0043211 A1 Feb. 11, 2016

Related U.S. Application Data

(63) Continuation of application No. 14/179,788, filed on Feb. 13, 2014, now Pat. No. 9,171,730.

(Continued)

(51) Int. Cl.
*H01L 29/778* (2006.01)
*H01L 21/283* (2006.01)
(Continued)

(52) U.S. Cl.
CPC ........ *H01L 29/7787* (2013.01); *H01L 21/283* (2013.01); *H01L 21/28114* (2013.01);
(Continued)

(58) Field of Classification Search
None
See application file for complete search history.

(56) References Cited

U.S. PATENT DOCUMENTS

| 4,300,091 A | 11/1981 | Schade, Jr. |
| 4,645,562 A | 2/1987 | Liao et al. |

(Continued)

FOREIGN PATENT DOCUMENTS

| CN | 1748320 | 3/2006 |
| CN | 101107713 | 1/2008 |

(Continued)

OTHER PUBLICATIONS

Authorized officer Chung Keun Lee, International Search Report and Written Opinion in PCT/US2008/076030, mailed Mar. 23, 2009, 10 pages.

(Continued)

*Primary Examiner* — Minh-Loan Tran
(74) *Attorney, Agent, or Firm* — Fish & Richardson P.C.

(57) ABSTRACT

A III-N semiconductor HEMT device includes an electrode-defining layer on a III-N material structure. The electrode-defining layer has a recess with a first sidewall proximal to the drain and a second sidewall proximal to the source, each sidewall comprising a plurality of steps. A portion of the recess distal from the III-N material structure has a larger width than a portion of the recess proximal to the III-N material structure. An electrode is in the recess, the electrode including an extending portion over the first sidewall. A portion of the electrode-defining layer is between the extending portion and the III-N material structure. The first sidewall forms a first effective angle relative to the surface of the III-N material structure and the second sidewall forms a second effective angle relative to the surface of the III-N material structure, the second effective angle being larger than the first effective angle.

21 Claims, 17 Drawing Sheets

Related U.S. Application Data

(60) Provisional application No. 61/765,635, filed on Feb. 15, 2013.

(51) Int. Cl.

| | | |
|---|---|---|
| *H01L 29/41* | (2006.01) | |
| *H01L 29/40* | (2006.01) | |
| *H01L 29/423* | (2006.01) | |
| *H01L 29/66* | (2006.01) | |
| *H01L 29/04* | (2006.01) | |
| *H01L 29/20* | (2006.01) | |
| *H01L 21/28* | (2006.01) | |
| *H01L 21/768* | (2006.01) | |
| *H01L 23/29* | (2006.01) | |
| *H01L 23/31* | (2006.01) | |
| *H01L 29/205* | (2006.01) | |
| *H01L 21/285* | (2006.01) | |
| *H01L 29/417* | (2006.01) | |
| *H01L 29/06* | (2006.01) | |

(52) U.S. Cl.
CPC .. *H01L 21/28593* (2013.01); *H01L 21/76804* (2013.01); *H01L 23/291* (2013.01); *H01L 23/3171* (2013.01); *H01L 29/045* (2013.01); *H01L 29/2003* (2013.01); *H01L 29/205* (2013.01); *H01L 29/402* (2013.01); *H01L 29/41* (2013.01); *H01L 29/41725* (2013.01); *H01L 29/4236* (2013.01); *H01L 29/42316* (2013.01); *H01L 29/42376* (2013.01); *H01L 29/66462* (2013.01); *H01L 29/778* (2013.01); *H01L 21/28581* (2013.01); *H01L 21/28587* (2013.01); *H01L 29/0696* (2013.01); *H01L 29/41766* (2013.01); *H01L 29/4238* (2013.01); *H01L 2924/0002* (2013.01)

(56) References Cited

U.S. PATENT DOCUMENTS

| | | | |
|---|---|---|---|
| 4,728,826 A | 3/1988 | Einzinger et al. | |
| 4,821,093 A | 4/1989 | Iafrate et al. | |
| 4,914,489 A | 4/1990 | Awano | |
| 5,051,618 A | 9/1991 | Lou | |
| 5,329,147 A | 7/1994 | Vo et al. | |
| 5,618,384 A | 4/1997 | Chan et al. | |
| 5,646,069 A | 7/1997 | Jelloian et al. | |
| 5,663,091 A | 9/1997 | Yen et al. | |
| 5,705,847 A | 1/1998 | Kashiwa et al. | |
| 5,714,393 A | 2/1998 | Wild et al. | |
| 5,909,103 A | 6/1999 | Williams | |
| 5,998,810 A | 12/1999 | Hatano et al. | |
| 6,008,684 A | 12/1999 | Ker et al. | |
| 6,097,046 A | 8/2000 | Plumton | |
| 6,100,571 A | 8/2000 | Mizuta et al. | |
| 6,316,793 B1 | 11/2001 | Sheppard et al. | |
| 6,373,082 B1 | 4/2002 | Ohno et al. | |
| 6,475,889 B1 | 11/2002 | Ring | |
| 6,486,502 B1 | 11/2002 | Sheppard et al. | |
| 6,504,235 B2 | 1/2003 | Schmitz et al. | |
| 6,515,303 B2 | 2/2003 | Ring | |
| 6,548,333 B2 | 4/2003 | Smith | |
| 6,583,454 B2 | 6/2003 | Sheppard et al. | |
| 6,586,781 B2 | 7/2003 | Wu et al. | |
| 6,649,497 B2 | 11/2003 | Ring | |
| 6,727,531 B1 | 4/2004 | Redwing et al. | |
| 6,777,278 B2 | 8/2004 | Smith | |
| 6,849,882 B2 | 2/2005 | Chavarkar et al. | |
| 6,867,078 B1 | 3/2005 | Green et al. | |
| 6,876,235 B2 | 4/2005 | Li et al. | |
| 6,946,739 B2 | 9/2005 | Ring | |
| 6,979,863 B2 | 12/2005 | Ryu | |
| 6,982,204 B2 | 1/2006 | Saxler et al. | |
| 7,030,428 B2 | 4/2006 | Saxler | |
| 7,045,404 B2 | 5/2006 | Sheppard et al. | |
| 7,071,498 B2 | 7/2006 | Johnson et al. | |
| 7,084,475 B2 | 8/2006 | Shelton et al. | |
| 7,125,786 B2 | 10/2006 | Ring et al. | |
| 7,126,212 B2 | 10/2006 | Enquist et al. | |
| 7,161,194 B2 | 1/2007 | Parikh et al. | |
| 7,170,111 B2 | 1/2007 | Saxler | |
| 7,230,284 B2 | 6/2007 | Parikh et al. | |
| 7,238,560 B2 | 7/2007 | Sheppard et al. | |
| 7,253,454 B2 | 8/2007 | Saxler | |
| 7,265,399 B2 | 9/2007 | Sriram et al. | |
| 7,268,375 B2 | 9/2007 | Shur et al. | |
| 7,304,331 B2 | 12/2007 | Saito et al. | |
| 7,321,132 B2 | 1/2008 | Robinson et al. | |
| 7,326,971 B2 | 2/2008 | Harris et al. | |
| 7,332,795 B2 | 2/2008 | Smith et al. | |
| 7,364,988 B2 | 4/2008 | Harris et al. | |
| 7,388,236 B2 | 6/2008 | Wu et al. | |
| 7,419,892 B2 | 9/2008 | Sheppard et al. | |
| 7,432,142 B2 | 10/2008 | Saxler et al. | |
| 7,449,730 B2 | 11/2008 | Kuraguchi | |
| 7,456,443 B2 | 11/2008 | Saxler et al. | |
| 7,465,967 B2 | 12/2008 | Smith et al. | |
| 7,501,669 B2 | 3/2009 | Parikh et al. | |
| 7,544,963 B2 | 6/2009 | Saxler | |
| 7,547,925 B2 | 6/2009 | Wong et al. | |
| 7,548,112 B2 | 6/2009 | Sheppard | |
| 7,550,783 B2 | 6/2009 | Wu et al. | |
| 7,550,784 B2 | 6/2009 | Saxler et al. | |
| 7,566,918 B2 | 7/2009 | Wu et al. | |
| 7,573,078 B2 | 8/2009 | Wu et al. | |
| 7,592,211 B2 | 9/2009 | Sheppard et al. | |
| 7,598,108 B2 | 10/2009 | Li et al. | |
| 7,612,390 B2 | 11/2009 | Saxler et al. | |
| 7,615,774 B2 | 11/2009 | Saxler | |
| 7,638,818 B2 | 12/2009 | Wu et al. | |
| 7,678,628 B2 | 3/2010 | Sheppard et al. | |
| 7,692,263 B2 | 4/2010 | Wu et al. | |
| 7,709,269 B2 | 5/2010 | Smith et al. | |
| 7,709,859 B2 | 5/2010 | Smith et al. | |
| 7,714,360 B2 | 5/2010 | Otsuka et al. | |
| 7,745,851 B2 | 6/2010 | Harris | |
| 7,755,108 B2 | 7/2010 | Kuraguchi | |
| 7,759,700 B2 | 7/2010 | Ueno et al. | |
| 7,777,252 B2 | 8/2010 | Sugimoto et al. | |
| 7,777,254 B2 | 8/2010 | Sato | |
| 7,795,642 B2 | 9/2010 | Suh et al. | |
| 7,812,369 B2 | 10/2010 | Chini et al. | |
| 7,855,401 B2 | 12/2010 | Sheppard et al. | |
| 7,875,537 B2 | 1/2011 | Suvorov et al. | |
| 7,875,914 B2 | 1/2011 | Sheppard | |
| 7,884,395 B2 | 2/2011 | Saito | |
| 7,892,974 B2 | 2/2011 | Ring et al. | |
| 7,893,500 B2 | 2/2011 | Wu et al. | |
| 7,898,004 B2 | 3/2011 | Wu et al. | |
| 7,901,994 B2 | 3/2011 | Saxler et al. | |
| 7,906,799 B2 | 3/2011 | Sheppard et al. | |
| 7,915,643 B2 | 3/2011 | Suh et al. | |
| 7,915,644 B2 | 3/2011 | Wu et al. | |
| 7,919,791 B2 | 4/2011 | Flynn et al. | |
| 7,928,475 B2 | 4/2011 | Parikh et al. | |
| 7,955,918 B2 | 6/2011 | Wu et al. | |
| 7,955,984 B2 | 6/2011 | Ohki | |
| 7,960,756 B2 | 6/2011 | Sheppard et al. | |
| 7,965,126 B2 | 6/2011 | Honea et al. | |
| 7,985,986 B2 | 7/2011 | Heikman et al. | |
| 8,049,252 B2 | 11/2011 | Smith et al. | |
| 8,390,000 B2 * | 3/2013 | Chu | H01L 21/28587 |
| | | | 257/76 |
| 8,519,438 B2 | 8/2013 | Mishra et al. | |
| 9,257,513 B1 * | 2/2016 | Liu | H01L 21/02304 |
| 2001/0032999 A1 | 10/2001 | Yoshida | |
| 2001/0040247 A1 | 11/2001 | Ando et al. | |
| 2002/0036287 A1 | 3/2002 | Yu et al. | |
| 2002/0121648 A1 | 9/2002 | Hsu et al. | |
| 2002/0167023 A1 | 11/2002 | Chavarkar et al. | |
| 2003/0003724 A1 | 1/2003 | Uchiyama et al. | |
| 2003/0006437 A1 | 1/2003 | Mizuta et al. | |

(56) References Cited

U.S. PATENT DOCUMENTS

| | | |
|---|---|---|
| 2003/0020092 A1 | 1/2003 | Parikh et al. |
| 2004/0041169 A1 | 3/2004 | Ren et al. |
| 2004/0061129 A1 | 4/2004 | Saxler et al. |
| 2004/0164347 A1 | 8/2004 | Zhao et al. |
| 2005/0001235 A1 | 1/2005 | Murata et al. |
| 2005/0077541 A1 | 4/2005 | Shen et al. |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0253168 A1 | 11/2005 | Wu et al. |
| 2005/0274977 A1 | 12/2005 | Saito et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0076677 A1 | 4/2006 | Daubenspeck et al. |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0226442 A1 | 10/2006 | Zhang et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0278518 A1 | 12/2007 | Chen et al. |
| 2007/0295985 A1 | 12/2007 | Weeks, Jr. et al. |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0296618 A1 | 12/2008 | Suh et al. |
| 2008/0308813 A1 | 12/2008 | Suh et al. |
| 2009/0001409 A1 | 1/2009 | Takano et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0057720 A1 | 3/2009 | Kaneko |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0072272 A1 | 3/2009 | Suh et al. |
| 2009/0075455 A1 | 3/2009 | Mishra |
| 2009/0085065 A1 | 4/2009 | Mishra et al. |
| 2009/0121775 A1 | 5/2009 | Ueda et al. |
| 2009/0140262 A1 | 6/2009 | Ohki et al. |
| 2009/0146185 A1 | 6/2009 | Suh et al. |
| 2009/0201072 A1 | 8/2009 | Honea et al. |
| 2009/0218598 A1 | 9/2009 | Goto |
| 2009/0267078 A1 | 10/2009 | Mishra et al. |
| 2010/0019225 A1 | 1/2010 | Lee |
| 2010/0019279 A1 | 1/2010 | Chen et al. |
| 2010/0065923 A1 | 3/2010 | Charles et al. |
| 2010/0067275 A1 | 3/2010 | Wang et al. |
| 2010/0102359 A1 | 4/2010 | Khan et al. |
| 2010/0140660 A1 | 6/2010 | Wu et al. |
| 2010/0201439 A1 | 8/2010 | Wu et al. |
| 2010/0203234 A1 | 8/2010 | Anderson et al. |
| 2010/0219445 A1 | 9/2010 | Yokoyama et al. |
| 2010/0244087 A1 | 9/2010 | Horie et al. |
| 2010/0264461 A1 | 10/2010 | Rajan et al. |
| 2010/0288998 A1 | 11/2010 | Kikuchi et al. |
| 2011/0006346 A1 | 1/2011 | Ando et al. |
| 2011/0012110 A1 | 1/2011 | Sazawa et al. |
| 2011/0049526 A1 | 3/2011 | Chu et al. |
| 2011/0127604 A1* | 6/2011 | Sato .............. H01L 29/402 257/332 |
| 2011/0249359 A1 | 10/2011 | Mochizuki et al. |
| 2012/0168822 A1 | 7/2012 | Matsushita |
| 2012/0193638 A1 | 8/2012 | Keller et al. |
| 2012/0211800 A1 | 8/2012 | Boutros |
| 2012/0217512 A1 | 8/2012 | Renaud |
| 2012/0223320 A1* | 9/2012 | Dora .............. H01L 29/1608 257/76 |
| 2012/0315445 A1 | 12/2012 | Mizuhara et al. |
| 2014/0231823 A1 | 8/2014 | Chowdhury et al. |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |

(56) References Cited

FOREIGN PATENT DOCUMENTS

| WO | WO 2010/068554 | 6/2010 |
|---|---|---|
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25 2010, 6 pages.
Authorized officer Chung Keun Lee, International Search Report and Written Opinion in PCT/US2008/076199, mailed Mar. 24, 2009, 11 pages.
Authorized officer Dorothée Müllhausen, International Preliminary Report on Patentability, in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.

Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer June Young Son, International Search Report and Written Opinion in PCT/US2014/016298, mailed May 23, 2014, 15 pages.
Authorized officer Kihwan Moon, International Preliminary Report on Patentability in PCT/US2014/016298, mailed Aug. 27, 2015, 12 pages.
Search Report and Action in TW Application No. 098132132, issued Dec. 6, 2012, 8 pages.
Chinese First Office Action for Application No. 200880120050.6, Aug. 2, 2011, 10 pages.
Chinese First Office Action for Application No. 200980114639.X, May 14, 2012, 13 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.

(56) References Cited

OTHER PUBLICATIONS

Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design," Applied Physics Letters, 2002, 80(23):4387-4389.
Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage," Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "N-face High Electron Mobility Transistors with Low Buffer Leakage and Low Parasitic Resistance," U.S. Appl. No. 60/908,914, filed Mar. 29, 2007, 21 pages.
Mishra et al., "Polarization-induced Barriers for N-face Nitride-based Electronics," U.S. Appl. No. 60/940,052, filed May 24, 2007, 29 pages.
Mishra et al., "Growing N-polar III-nitride structures," U.S. Appl. No. 60/972,467, filed Sep. 14, 2007, 7 pages.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.

Napierala et al., "Selective GaN Epitaxy on Si(111) Substrates Using Porous Aluminum Oxide Buffer Layers," Journal of the Electrochemical Society, 2006. 153(2):G125-G127, 4 pages.
Ota and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
"Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AlN Interlayers," Journal of Crystal Growth, 2003, 248:563-567.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode $n$-channel GaN MOSFETs Fabricated on $p$-GaN Using $HfO_2$ as Gate Oxide," Electronics Letters, 2007, vol. 43, No. 17, 2 pages.
Suh et al., "High Breakdown Enhancement Mode GaN-based HEMTs with Integrated Slant Field Plate," U.S. Appl. No. 60/822,886, filed Aug. 18, 2006, 16 pages.
Suh et al. "High-Breakdown Enhancement-mode AlGaN/GaN HEMTs with Integrated Slant Field-Plate," Electron Devices Meeting, 2006, IEDM '06 International, 3 pages.
Suh et al., "III-Nitride Devices with Recessed Gates," U.S. Appl. No. 60/972,481, filed Sep. 14, 2007, 18 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al , "Enhancement-mode $Si_3N_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1 MHz," Electronic Device Letters, 2008, IEEE, 29(8):824-826.
Yoshida, "AlGan/GaN Power FET," Furukawa Review, 2002, 21:7-11.

(56) References Cited

OTHER PUBLICATIONS

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

* cited by examiner

_US 9,520,491 B2_

ELECTRODES FOR SEMICONDUCTOR DEVICES AND METHODS OF FORMING THE SAME

CROSS-REFERENCE TO RELATED APPLICATIONS

This is a continuation of U.S. application Ser. No. 14/179,788, filed on Feb. 13, 2014, which claims priority to U.S. Provisional Application No. 61/765,635, filed on Feb. 15, 2013. The disclosures of the prior applications are considered part of and are incorporated by reference in the disclosure of this application.

TECHNICAL FIELD

This invention relates to semiconductor electronic devices, specifically devices with electrodes connected to field plates.

BACKGROUND

To date, modern power semiconductor diodes such as high-voltage P-I-N diodes, as well as power transistors such as power MOSFETs and Insulated Gate Bipolar Transistors (IGBT), have been typically fabricated with silicon (Si) semiconductor materials. More recently, silicon carbide (SiC) power devices have been researched due to their superior properties. III-Nitride (III-N) semiconductor devices are now emerging as an attractive candidate to carry large currents and support high voltages, and provide very low on resistance, high voltage device operation, and fast switching times. As used herein, the terms III-N or III-Nitride materials, layers, devices, etc., refer to a material or device comprised of a compound semiconductor material according to the stoichiometric formula $B_wAl_xIn_yGa_zN$, where w+x+y+z is about 1.

An example of a III-N high electron mobility transistors (HEMT) of the prior art is shown in FIGS. 1 and 2. The III-N HEMT of FIG. 1 includes a substrate 10, a III-N channel layer 11, such as a layer of GaN, atop the substrate, and a III-N barrier layer 12, such as a layer of $Al_xGa_{1-x}N$, atop the channel layer. A two-dimensional electron gas (2DEG) channel 19 is induced in the channel layer 11 near the interface between the channel layer 11 and the barrier layer 12. Source and drain contacts 14 and 15, respectively, form ohmic contacts to the 2DEG channel. Gate contact 16 modulates the portion of the 2DEG in the gate region, i.e., directly beneath gate contact 16.

Field plates are commonly used in III-N devices to shape the electric field in the high-field region of the device in such a way that reduces the peak electric field and increases the device breakdown voltage, thereby allowing for higher voltage operation. An example of a field plated III-N HEMT of the prior art is shown in FIG. 2. In addition to the layers included in the device of FIG. 1, the device in FIG. 2 includes a field plate 18 which is connected to gate 16, and an insulator layer 13, such as a layer of SiN, is between the field plate 18 and the III-N barrier layer 12. Field plate 18 can include or be formed of the same material as gate 16. Insulator layer 13 can act as a surface passivation layer, preventing or suppressing voltage fluctuations at the surface of the III-N material adjacent to insulator layer 13.

Slant field plates have been shown to be particularly effective in reducing the peak electric field and increasing the breakdown voltage in III-N devices. A prior art III-N device similar to that of FIG. 2, but with a slant field plate 24, is shown in FIG. 3. In this device, gate 16 (i.e., the portion of electrode 29 that is between the vertical dashed lines) and slant field plate 24 are formed of a single electrode 29. Insulator layer 23, which can be SiN, is an electrode-defining layer that contains a recess which defines at least in part the shape of electrode 29. Electrode-defining layer 23 can also act as a surface passivation layer, preventing or suppressing voltage fluctuations at the surface of the III-N material adjacent to electrode-defining layer 23. The gate 16 and slant field plate 24 in this device can be formed by first depositing electrode-defining layer 23 over the entire surface of III-N barrier layer 12, then etching a recess through the electrode-defining layer 23 in the region containing gate 16, the recess including a slanted sidewall 25, and finally depositing electrode 29 at least in the recess and over the slanted sidewall 25.

Slant field plates, such as field plate 24 in FIG. 3, tend to spread the electric fields in the device over a larger volume as compared to conventional field plates, such as field plate 18 in FIG. 3, which do not include a slanted portion. Hence, slant field plates tend to be more effective at reducing the peak electric field in the underlying device, thereby allowing for larger operating and breakdown voltages.

When the device of FIG. 3 is biased in the off state with a large voltage applied to the drain 15 relative to the source 14, the electric field in the semiconductor layers 11 and 12 is spread over the horizontal length of the field plate 24. As such, for a given thickness of the electrode-defining layer 23, the horizontal length of the region which the electric field is spread over, is largely determined by the angle 26 which the field plate forms with the surface 28 of the underlying III-N material structure. A smaller angle 26 results in a greater spreading of the electric fields, allowing for correspondingly larger operating and breakdown voltages of the device. For example, in a III-N device with an electrode-defining layer 23 which is about 0.85 microns thick, an angle of about 40 degrees or less may be required for reliable 50V or 100V operation, whereas an angle of about 10 degrees or less may be required for reliable 300V or 600V operation. However, decreasing the angle 26 results in a longer lateral extension of the field plate 24 towards the drain 15, which can necessitate a larger spacing between the gate 16 and drain 15. Furthermore, it can be difficult to reproducibly fabricate slant field plates 24 with such small angles 26. Field plate structures that can provide adequate suppression of peak electric fields and can be fabricated reproducibly are desirable.

SUMMARY

In a first aspect, a III-N transistor is described. The transistor includes a III-N material structure, a source and a drain, and an electrode-defining layer having a thickness. The electrode-defining layer is over a surface of the III-N material structure and includes a recess with a first sidewall proximal to the drain and a second sidewall proximal to the source, where the first and second sidewalls each comprise a plurality of steps. A portion of the recess distal from the III-N material structure has a first width, and a portion of the recess proximal to the III-N material structure has a second width, with the first width being larger than the second width. The transistor further includes an electrode in the recess, the electrode including an extending portion at least partially over the first sidewall. The first sidewall forms a first effective angle relative to the surface of the III-N material structure and the second sidewall forms a second effective angle relative to the surface of the III-N material structure, the second effective angle being larger than the first effective angle.

In a second aspect, a transistor is described. The transistor includes a semiconductor material structure including a channel therein, a source and a drain each in electrical contact with the channel, and an electrode between the source and the drain. The electrode includes a gate and an extending portion, with the extending portion extending from the gate towards the drain. The transistor has a gate-drain spacing of less than 20 microns, an off-state drain current per unit gate width of the transistor is about $10^{-8}$ Amps/mm or less while the gate is biased below a threshold voltage of the transistor relative to the source and a drain-source voltage of the transistor is about 600V or larger, and a dynamic on-resistance of the transistor when the transistor is switched on with a switching time of 2 microseconds or less is less than 1.1 times a DC on-resistance of the transistor.

In a third aspect, a transistor is described. The transistor includes a semiconductor material structure including a channel therein, a source and a drain each in electrical contact with the channel, and an electrode between the source and the drain. The electrode includes a gate and an extending portion, with the extending portion extending from the gate towards the drain. The transistor has a gate-drain spacing of less than 20 microns, the extending portion includes a plurality of steps, wherein the number of steps in the plurality of steps per micron of length of the extending portion is greater than 0.4, and an off-state drain current per unit gate width of the transistor is about $10^{-8}$ Amps/mm or less while the gate is biased below a threshold voltage of the transistor relative to the source and a drain-source voltage of the transistor is about 600V or larger.

In a fourth aspect, a method of forming a semiconductor device is described. The method includes providing a semiconductor material structure, forming an electrode-defining layer having a thickness on a surface of the semiconductor material structure, and patterning a masking layer over the electrode-defining layer, the masking layer including an opening having a width. The method further includes etching the electrode-defining layer to form a recess therein, the recess having a first sidewall and a second sidewall opposite the first sidewall, the first and second sidewalls each comprising a plurality of steps, where the first sidewall forms a first effective angle relative to the surface of the semiconductor material structure and the second sidewall forms a second effective angle relative to the surface of the semiconductor material structure, and a portion of the recess distal from the semiconductor material structure has a first width and a portion of the recess proximal to the semiconductor material structure has a second width, the first width being larger than the second width. The etching of the electrode-defining layer includes performing a first procedure and a second procedure, the first procedure comprising removing a portion of the electrode-defining layer, and the second procedure comprising removing a portion of the masking layer without entirely removing the masking layer, where the second procedure causes an increase in the width of the opening in the masking layer. Furthermore, the etching of the electrode-defining layer results in the second effective angle being larger than the first effective angle.

In a fifth aspect, a method of forming a semiconductor device is described. The method includes providing a semiconductor material structure, forming an electrode-defining layer having a thickness on a surface of the semiconductor material structure, and patterning a masking layer over the electrode-defining layer, the masking layer including an opening. The opening forms a pattern including a plurality of regions having a first width interlaced with a plurality of regions having a second width, the first width being larger than the second width. The method further includes etching the electrode-defining layer beneath the opening to form a recess therein, the recess having a first sidewall and a second sidewall, the first sidewall including a plurality of sections each adjacent to one of the regions having the first width, and the second sidewall including a plurality of sections each adjacent to one of the regions having the second width. Additionally, the etching results in an average slope of the sections of the second sidewall being larger than an average slope of the sections of the first sidewall.

Each of the devices and methods described herein can include one or more of the following features or steps. The second effective angle can be substantially larger than the first effective angle. The second effective angle can be at least 10 degrees larger than the first effective angle. The semiconductor or III-N material structure can include a first III-N material layer, a second III-N material layer, and a 2DEG channel induced in the first III-N material layer adjacent to the second III-N material layer as a result of a compositional difference between the first III-N material layer and the second III-N material layer. The first III-N material layer can include GaN and the second III-N material layer can include AlGaN, AlInN, AlInGaN, or BAlInGaN. The first III-N material layer and the second III-N material layer can be group III-face or [0 0 0 1] oriented or group-III terminated semipolar layers, and the second III-N material layer can be between the first III-N material layer and the electrode-defining layer. The first III-N material layer and the second III-N material layer can be N-face or [0 0 0 -1] oriented or nitrogen-terminated semipolar layers, and the first III-N material layer can be between the second III-N material layer and the electrode-defining layer. The recess can extend through the entire thickness of the electrode-defining layer. The recess can extend into the III-N material structure and/or through the 2DEG channel.

The electrode-defining layer can comprise $SiN_x$. A thickness of the electrode-defining layer can be between about 0.1 microns and 5 microns. The transistor can further comprise a dielectric passivation layer between the III-N material structure and the electrode-defining layer, the dielectric passivation layer directly contacting a surface of the III-N material adjacent to the electrode. The dielectric passivation layer can comprise $SiN_x$. The dielectric passivation layer can be between the electrode and the III-N material structure, such that the electrode does not directly contact the III-N material structure. The transistor can further include an additional insulating layer between the dielectric passivation layer and the electrode-defining layer. The additional insulating layer can comprise AlN. The extending portion of the electrode can directly contact the sidewall.

The electrode can include a gate in a gate region of the transistor, and the plurality of steps in the first and second sidewalls can each include a first step having a first step width directly adjacent to the gate, a second step having a second step width directly adjacent to the first step, and a third step having a third step width directly adjacent to the second step, wherein a ratio of the first step width to the second step width in the plurality of steps in the first sidewall is substantially the same as a ratio of the first step width to the second step width in the plurality of steps in the second sidewall. A ratio of the first step width to the third step width in the plurality of steps in the first sidewall can be substantially the same as a ratio of the first step width to the third step width in the plurality of steps in the second sidewall. A sum of the first step width, the second step width, and the third step width in the first sidewall can be greater than a sum of the first step width, the second step width, and the third step width in the second sidewall.

The semiconductor material structure can include a III-N material, and the channel can be in the III-N material. The DC on resistance of the transistor or device can be less than 12 ohm-millimeters. The field plate or the extending portion can have a length of 12 microns or less.

The etching can result in the second effective angle being substantially larger than the first effective angle. The etching can result in the second effective angle being at least 10 degrees larger than the first effective angle. The masking layer can comprise photoresist. The method can further comprise causing a redistribution of the photoresist in the masking layer prior to performing the etching step. Causing the redistribution of the photoresist can comprise thermally annealing the photoresist. The redistribution of the photoresist can result in the masking layer having a first slanted sidewall on one side of the opening and a second slanted sidewall on the opposite side of the opening. The redistribution of the photoresist can result in the second slanted sidewall having a greater slope than the first slanted sidewall. The method can further include removing the masking layer and forming an electrode in the recess. The etching can further include performing the first procedure a second time after the second procedure has been performed, and performing the second procedure a second time after the first procedure has been performed a second time. The etching can result in the recess extending through the entire thickness of the electrode-defining layer. The semiconductor material structure can comprise a III-N layer. The etching can comprise etching through the entire thickness of the electrode-defining layer and using the masking layer as an etch mask during the entirety of the etching. The etching can further comprise etching into a layer that is directly beneath the electrode-defining layer.

III-N devices which can be fabricated reproducibly, can support high voltages with low leakage, and at the same time can exhibit low on-resistance and high breakdown voltage, are described. Methods of forming the devices are also described. The III-N devices described herein can be transistors, and can be high-voltage devices suitable for high voltage applications. The details of one or more implementations of the invention are set forth in the accompanying drawings and description below. Other features and advantages of the invention will be apparent from the description and drawings, and from the claims.

DESCRIPTION OF DRAWINGS

Like reference symbols in the various drawings indicate like elements.

DETAILED DESCRIPTION

Transistors based on III-N heterostructures are described. An electrode of the device is designed such that the device can be fabricated reproducibly, can support high voltages with low leakage, and at the same time can exhibit low on-resistance and low gate capacitance. Methods of forming the electrode are also described. The III-N devices described herein can be high-voltage devices suitable for high voltage applications. In such a high-voltage transistor, when the transistor is biased off (i.e., the voltage on the gate relative to the source is less than the transistor threshold voltage), it is at least capable of supporting all source-drain voltages less than or equal to the high-voltage in the application in which it is used, which for example may be 100V, 300V, 600V, 1200V, 1700V, or higher. When the high voltage transistor is biased on (i.e., the voltage on the gate relative to the source is greater than the transistor threshold voltage), it is able to conduct substantial current with a low on-voltage. The maximum allowable on-voltage is the maximum voltage that can be sustained in the application in which the transistor is used.

Figure 1:
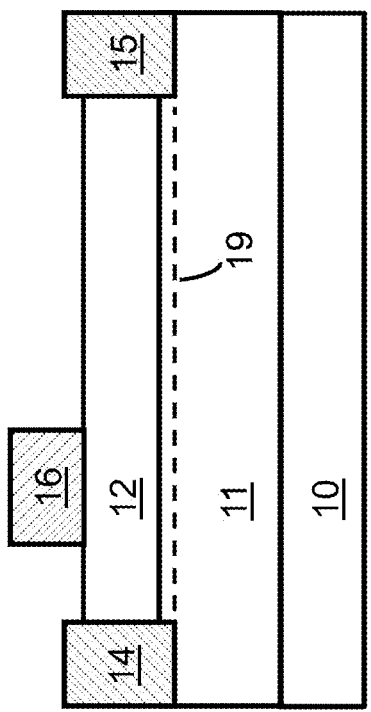
FIGS. 1-3 are cross-sectional views of III-N HEMT devices of the prior art.
Figure 2:
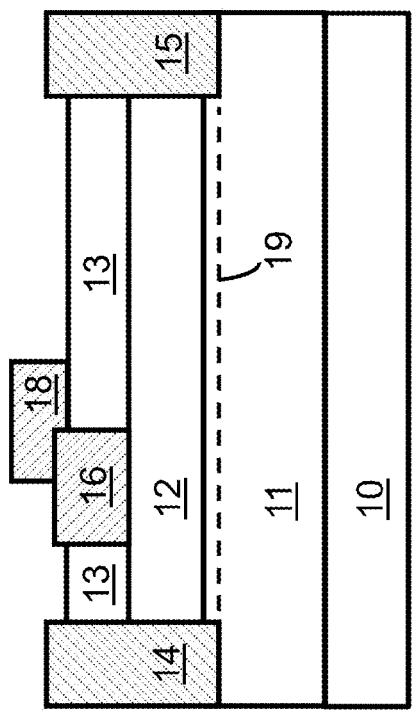
Figure 3:
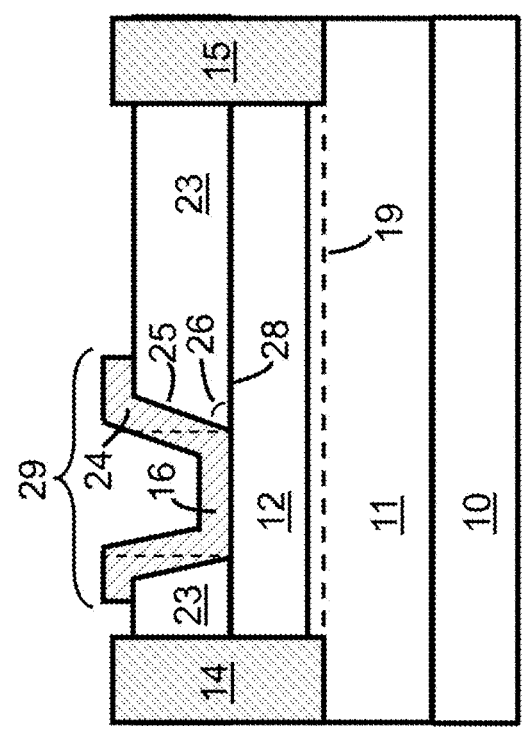

The transistors described herein each include a field plate structure which allows for comparable device operating and breakdown voltages to the device of FIG. 3, but which can be fabricated reproducibly. Additionally, the field plate configuration allows for a transistor designed for a given operating voltage to have a very small spacing between the gate and drain, in order to reduce the device on-resistance and minimize electrical losses.

The device described herein is illustrated in FIGS. 4-5 and 17-18. III-N transistors described herein each include an electrode-defining layer on top of a III-N material structure. The electrode-defining layer includes a recess, and an electrode is in the recess. The width at the top of the recess is greater than the width at the bottom of the recess. The electrode includes first and second extending portions on opposite sides of the electrode which are over portions of the electrode-defining layer. The first extending portion, which extends towards the drain electrode, functions as a field plate. The second extending portion extends towards the source electrode. The electrode is deposited conformally in the recess in the electrode-defining region with the extending portions over sidewalls of the recess. Hence, the profiles of the extending portions are at least partially determined by the profiles of the corresponding sidewalls. The sidewalls of the recess underneath the extending portions of the electrode include a plurality of steps. The sidewalls each form an effective angle relative to the uppermost surface of the underlying III-N material structure. The effective angle of the sidewall underneath the first extending portion, which defines (and is therefore the same as) the effective angle of the field plate, can be small enough to allow for high voltage operation of the device, as required by the circuit application in which the device is used. The effective angle of the sidewall underneath the second extending portion, which defines (and is therefore the same as) the effective angle of the second extending portion, is greater than the effective angle of the first extending portion. As compared to a device in which the first and second extending portions have substantially the same effective angle, this allows for a smaller gate-source capacitance for a given horizontal spacing between the source and the gate.

Figure 4:
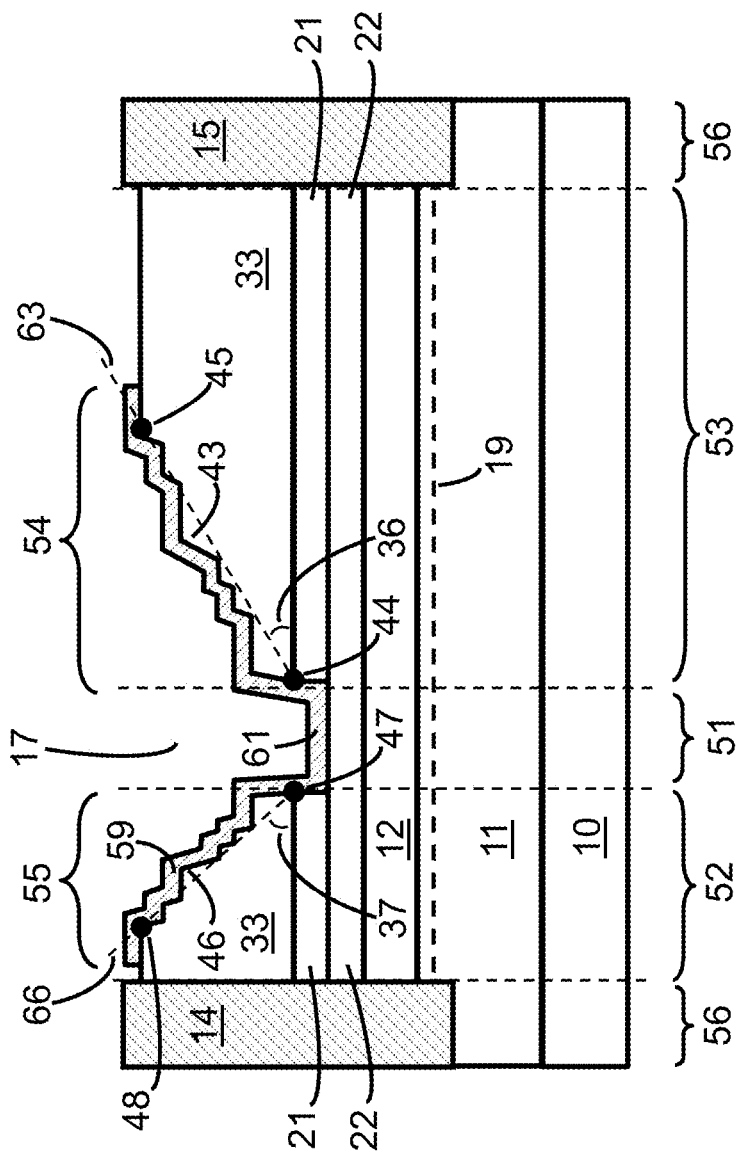
FIGS. 4-5 are cross-sectional views of implementations of III-N HEMT devices.

Referring to FIG. 4, a III-N HEMT includes a substrate 10 (although the substrate is optional), a first III-N layer 11 on top of the substrate, and a second III-N layer 12 on top of the first III-N layer. III-N layers 11 and 12 have different compositions from one another, the compositions selected such that a two-dimensional electron gas (2DEG) 19 (illustrated by a dashed line), i.e., a conductive channel, is induced in the first III-N layer 11 near the interface between the first and second III-N layers 11 and 12, respectively. An electrode-defining layer 33 is formed over the second III-N layer, the electrode-defining layer 33 including a recess 17 which can extend through the entire thickness of the electrode-defining layer 33. Alternatively, the recess 17 may only extend partially through the electrode-defining layer (not shown). The electrode-defining layer 33 is typically between about 0.1 microns and 5 microns thick, such as about 0.85 microns thick. The electrode-defining layer 33 can have a composition that is substantially uniform throughout. The electrode-defining layer 33 is formed of an insulator, such as silicon nitride ($SiN_x$).

A gate electrode 59 is formed in the recess. In the implementation shown in FIG. 4, the gate electrode 59 conformally covers the entire exposed surface in the recess, although in some implementations the gate electrode 59 only covers a portion of the exposed surface in the recess (not shown), as further described below. The portion 61 of gate electrode 59 in gate region 51 is the gate 61 of the device. Gate electrode 59 further includes a first extending portion 54, which is over at least a portion of the electrode-defining layer in the drain access region 53, and a second extending portion 55, which is over at least a portion of the electrode-defining layer in the source access region 52. The first extending portion 54 functions as a field plate, reducing the peak electric field in the device when the device is biased in the off state (i.e., with the gate-source voltage lower than the device threshold voltage) with a large drain-source voltage. The second extending portion 55 is included to ensure that the gate electrode 59 extends towards the source contact 14 at least beyond the source-side edge of the gate region 51 in case of misalignment of the gate electrode 59 to the recess during device fabrication. The gate electrode 59 is deposited conformally in the recess in the electrode-defining region.

The first extending portion 54 is over sidewall 43 of the recess, the sidewall 43 extending from point 44 (i.e., the portion of the electrode-defining layer 33 which is closest to gate region 51) all the way to the point 45 at the edge at the top of the recess which is closest to the drain. The second extending portion 55 is over sidewall 46 of the recess, the sidewall 46 extending from point 47 (i.e., the portion of the electrode-defining layer 33 which is closest to region 51) all the way to the point 48 at the edge at the top of the recess which is closest to the source. Hence, the profiles of the extending portions 54 and 55 are at least partially determined by the profiles of the sidewalls 43 and 46, respectively. Although the second extending portion 55 is shown to extend over the entire sidewall 46 at least to point 48, in some implementations extending portion 55 only extends part way up sidewall 46 (not shown). Having the second extending portion 55 only extend part way up sidewall 46 can decrease the gate capacitance, which improves the device performance. However, in some cases, having the second extending portion 55 extend over the entire sidewall 46 at least to point 48 reduces dispersion in comparison to a similar device in which the second extending portion 55 only extends part way up sidewall 46.

Source and drain contacts 14 and 15, respectively, are on opposite sides of the gate 59 and form ohmic contacts to the 2DEG channel 19. The III-N HEMT also includes a gate region 51, in which the gate 61 is deposited, and source and drain access regions 52 and 53, respectively, on opposite sides of the gate region. The regions 56 of the device structure in which the source and drain contacts 14 and 15, respectively, are deposited are referred to as the device ohmic regions. The source access region 52 is between the source contact 14 and gate 61 (i.e., the portion of gate electrode 59 that is in the gate region 51), and the drain access region 53 is between the drain contact 15 and gate 61. The III-N HEMT may also include additional III-N layers (not shown), for example a III-N buffer layer between the first III-N layer 11 and the substrate 10, or a III-N layer such as AlN between the first III-N layer 11 and the second III-N layer 12. The III-N HEMT can also optionally include a passivation layer 22 which contacts the III-N material surface at least in the access regions, and an additional dielectric layer 21 (also optional) between the passivation layer 22 and the electrode-defining layer 33. As shown in FIG. 4, the recess 17 in the electrode-defining layer 33 can extend through the entire thickness of the additional dielectric layer 21 but not through the passivation layer 22. Hence, passivation layer 22 can be between the III-N materials and gate 61 in the gate region 51, thereby serving as a gate insulator. A gate insulator can help prevent gate leakage currents in the HEMT.

Dispersion refers to a difference in observed current-voltage (I-V) characteristics when the device is operated under RF or switching conditions, as compared to when the device is operated under DC conditions. In III-N devices, effects such as dispersion are often caused by voltage fluctuations at the uppermost surface(s) of the III-N material layers, the result of charging of surface states during device operation. Accordingly, a passivation layer such as layer 22 in FIG. 4 prevents or suppresses dispersion by preventing or suppressing voltage fluctuations at the uppermost III-N surface.

In implementations where passivation layer 22 is included, electrode-defining layer 33 in combination with passivation layer 22 maintains effective passivation of the uppermost III-N surface of the device. When an additional dielectric layer 21, such as AlN, is included between the passivation layer 22 and electrode-defining layer 33, the additional dielectric layer 21 may need to be made thin enough, such as thinner than about 20 nm, thinner than about 10 nm, or thinner than about 5 nm, to ensure that effective passivation of the uppermost III-N surface is still maintained. Too thick an additional dielectric layer 21, such as greater than about 20 nm, can degrade the passivation effects of layers 22 and 33.

The III-N HEMT of FIG. 4 can be an enhancement-mode (i.e., normally off, with a threshold voltage greater than 0V) or a depletion-mode (i.e., normally on, with a threshold voltage less than 0V) device. Other configurations for the III-N HEMT of FIG. 4 are also possible. For example, in one implementation, the recess 17 in the electrode-defining layer 33 only extends partially through the thickness of the electrode-defining layer 33, such that a portion of the electrode-defining layer 33 is between the III-N materials and gate 61 in the gate region (not shown). In this case, electrode-defining layer 33 can also function as a gate insulator, and it may be possible to omit the passivation layer 22 and/or the additional dielectric layer 21. In another implementation, the recess 17 in the electrode-defining layer 33 additionally extends through the entire thickness of the passivation layer 22, and the gate 61 directly contacts the underlying III-N material (not shown). In yet another implementation, the recess 17 further extends into the III-N materials, as shown in FIG. 5.

Figure 5:
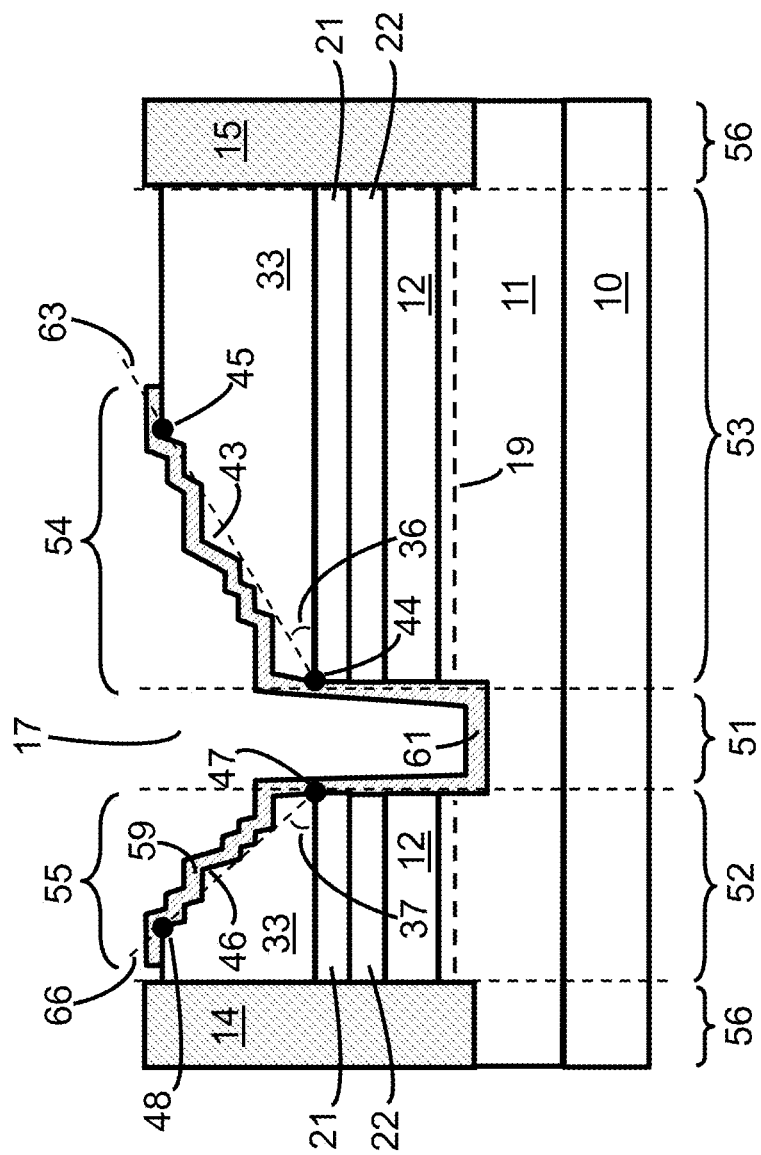

FIG. 5 illustrates a III-N HEMT which is similar to that of FIG. 4, except that prior to deposition of gate electrode 59, the recess 17 in the electrode-defining layer 33 is further etched to extend through the passivation layer 22 and into the III-N material structure (layers 11 and 12). As shown in FIG. 5, the recess 17 can extend through the 2DEG 19. In the case where the recess 17 extends through the 2DEG 19, the HEMT may be an enhancement-mode device.

Referring to FIGS. 4 and 5, sidewalls 43 and 46 of the electrode-defining layer 33 each include a plurality of steps (and hence the extending portions 54 and 55 of the gate electrode 59 also each include a plurality of steps). The sidewalls 43 and 46 each have an effective slope, which is equal to the slope of the dashed lines 63 and 66, respectively, where dashed line 63 passes through points 44 and 45, and dashed line 66 passes through points 47 and 48. As such, the sidewalls 43 and 46 each form an effective angle 36 and 37, respectively, with the uppermost surface of the underlying III-N material structure. Or stated differently, each of sidewalls 43 and 46 have an effective slope, the effective slope being equal to the slope of dashed line 63 and 66, respectively.

As shown in FIGS. 4 and 5, the effective slope of sidewall 46 is greater than, and in many cases substantially greater than, the effective slope of sidewall 43. Correspondingly, the effective angle 37 formed by sidewall 46 relative to the uppermost surface of the III-N material structure is larger, for example substantially larger or at least 10 degrees larger, than the effective angle 36 formed by sidewall 43 relative to the uppermost surface of the III-N material structure. The effective angle 36 of the sidewall 43 that is adjacent to the drain 15 is maintained sufficiently small to allow for larger off-state voltages to be applied without the device suffering from high-field breakdown or other deleterious effects associated with large electric fields in the device. That is, increasing effective angle 36 typically results in an increase in the peak electric field in the device for a given drain-source voltage when the device is in the off state (i.e., when the gate is biased relative to the source at a voltage which is less than the device threshold voltage), leading to lower off-state operating and breakdown voltages. However, for a given separation between the source 14 and gate 61, increasing the effective angle 37 of sidewall 46 can reduce the gate-source capacitance, which can be beneficial for device performance. If the effective angle 37 were made to be substantially the same as angle 36, rather than being greater than angle 37 as shown, the separation between the source 14 and the gate 61 may need to be increased to allow for reliable device fabrication and to prevent the gate-source capacitance from being too large.

Figure 6:
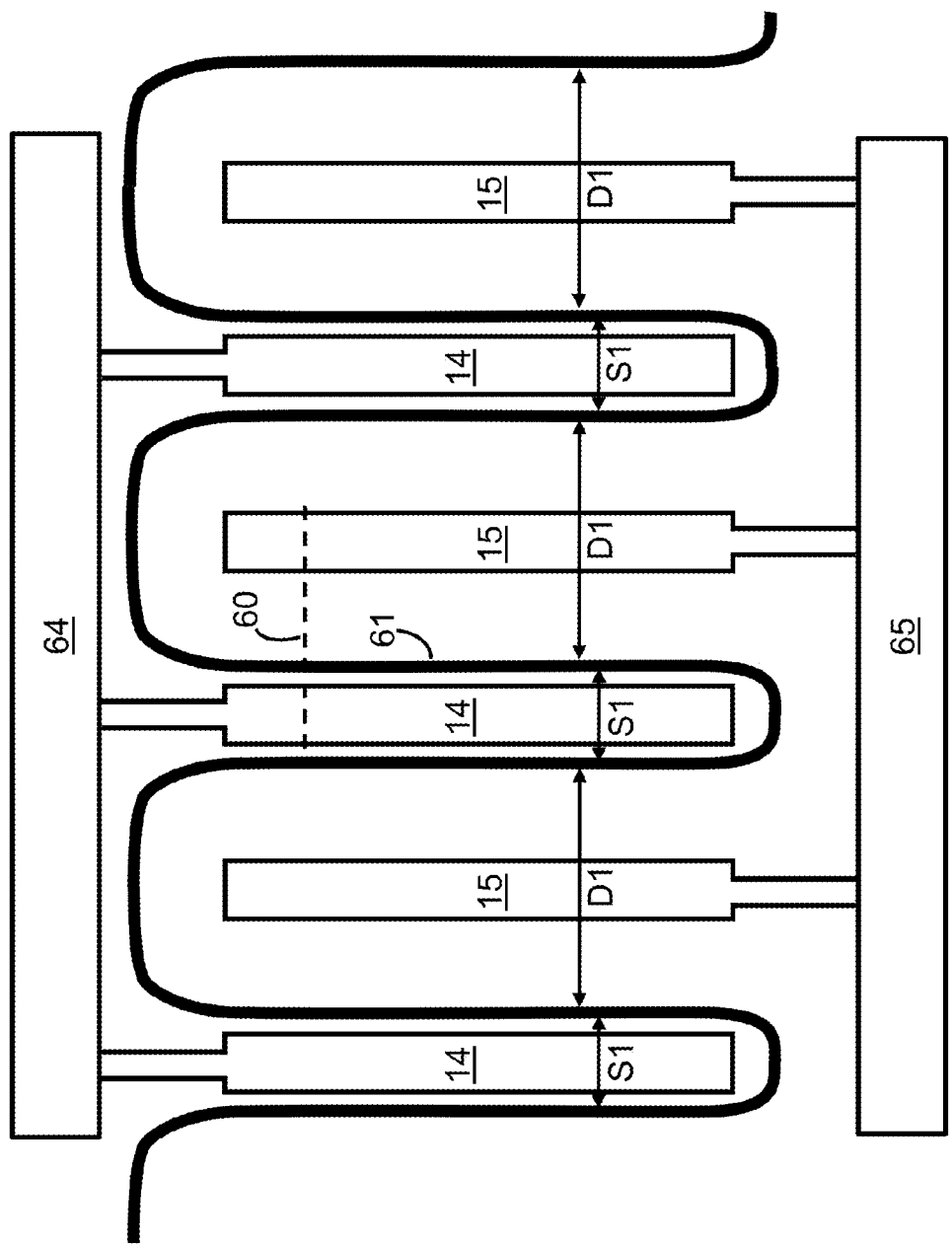
FIG. 6 is a plan view of the III-N HEMTs of FIGS. 4 and 5.

FIG. 6 is a plan view (top view) of the devices of FIGS. 4 and 5, and includes alternating "fingers" of source contact 14 and drain contact 15, with the source contacts 14 connected to a source contact pad 64 and the drain contacts 15 connected to a drain contact pad 65. Dashed line 60 indicates the slice corresponding to the cross sections illustrated in FIGS. 4 and 5. As shown in FIG. 6, the gate 61 is formed in a serpentine-like pattern with regions of width S1 interlaced with regions of width D1, where D1 is substantially larger than S1. The fingers of source contact 14 are in the regions of width S1, and the fingers of drain contact 15 are in the regions of width D1. The gate 61 may also be connected to a gate contact pad (not shown). Although FIG. 6 illustrates 3 source fingers and 3 drain fingers, in general the device can include fewer or more source and drain fingers.

Forming the recess 17 containing the gate electrode 59 in the shapes illustrated in FIGS. 4 and 5, where each of sidewalls 43 and 46 include a plurality of steps and have a different effective slope can be difficult to achieve reproducibly using conventional techniques. A simple and reproducible method of fabricating the devices of FIGS. 4-6 is illustrated in FIGS. 7-16. The method utilizes the difference in widths S1 and D1, described above with reference to FIG. 6, in order to achieve a recess 17 in the electrode-defining layer 33 having the profile shown in FIGS. 4 and 5, where the effective slope of sidewall 46 is greater than the effective slope of sidewall 43. The method only requires a single lithography step yet still achieves a profile for recess 17 in which the effective slope of sidewall 46 is greater (e.g., substantially greater) than the effective slope of sidewall 43. Other processes that can be used to achieve such a profile typically involve multiple lithography steps and are therefore more complicated and expensive than the method illustrated in FIGS. 7-16 and described below.

Figure 7:
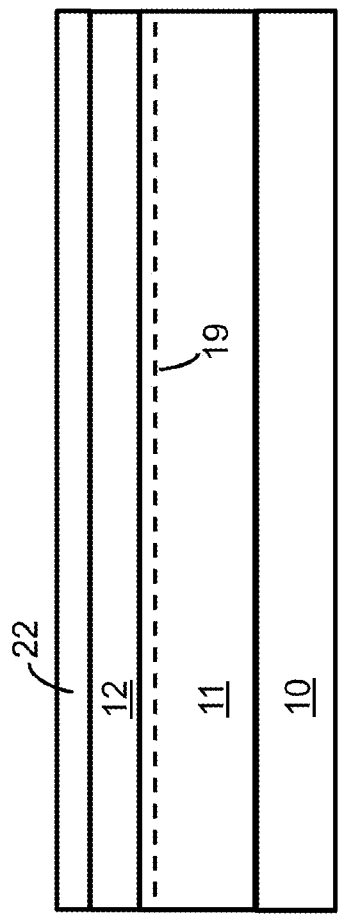
FIGS. 7-17 illustrate a method of forming the III-N HEMT of FIG. 4.
Figure 8A:
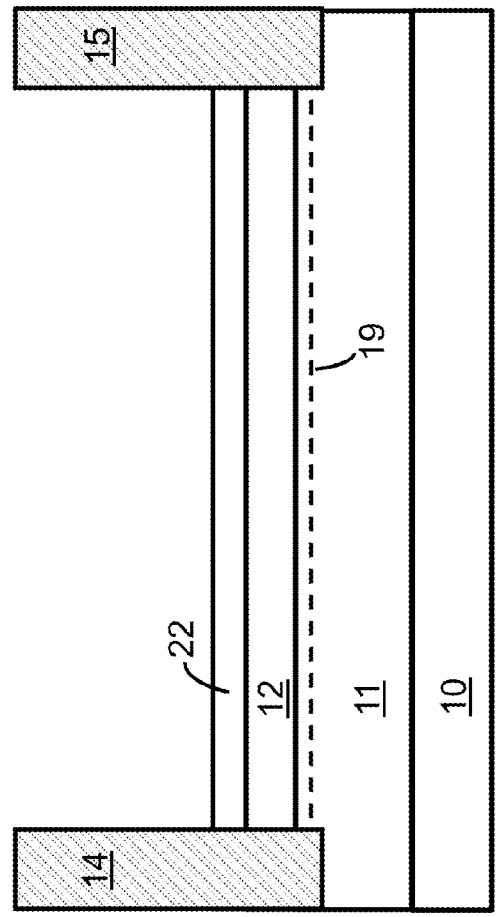
Figure 8B:
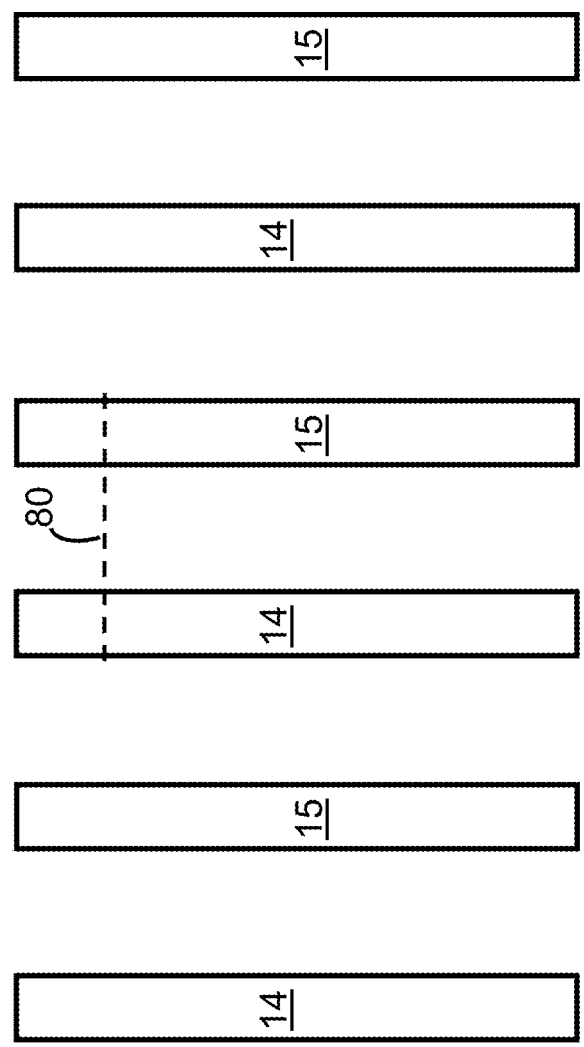

Referring to FIG. 7, III-N material layers 11 and 12 are formed on substrate 10, for example by metalorganic chemical vapor deposition (MOCVD) or molecular beam epitaxy (MBE). Passivation layer 22, formed over the III-N material layers 11 and 12, is then deposited by methods such as MOCVD or plasma enhanced chemical vapor deposition (PECVD). Next, as seen in FIG. 8A, source and drain contacts 14 and 15, respectively, are formed. The source and drain contacts are in electrical contact with the 2DEG 19 induced in the III-N material layers. Source and drain contacts 14 and 15, respectively, can be formed in a number of ways. For example, a metal or combination of metals can be deposited, for example by evaporation, sputtering, or CVD, in ohmic contact regions 56 (shown in FIG. 4) upon the surface of layer 12, followed by a thermal anneal which results in the deposited metal forming a metallic alloy with the underlying semiconductor material. Alternatively, n-type dopants can be ion implanted into ohmic regions 56, followed by a metal deposition by evaporation, sputtering, or CVD, atop this region. Or the material in ohmic contact regions 56 can be etched away, n-type material can be regrown in this region by MOCVD or MBE, and metal can then be deposited atop this region. FIG. 8B shows a plan view of the device in FIG. 8A, where dashed line 80 indicates the cross section illustrated in FIG. 8A. As seen in FIG. 8B, alternating fingers of source contacts 14 and drain contacts 15 are deposited, such that the spacing between adjacent source and drain fingers is approximately the same throughout the device.

Figure 9:
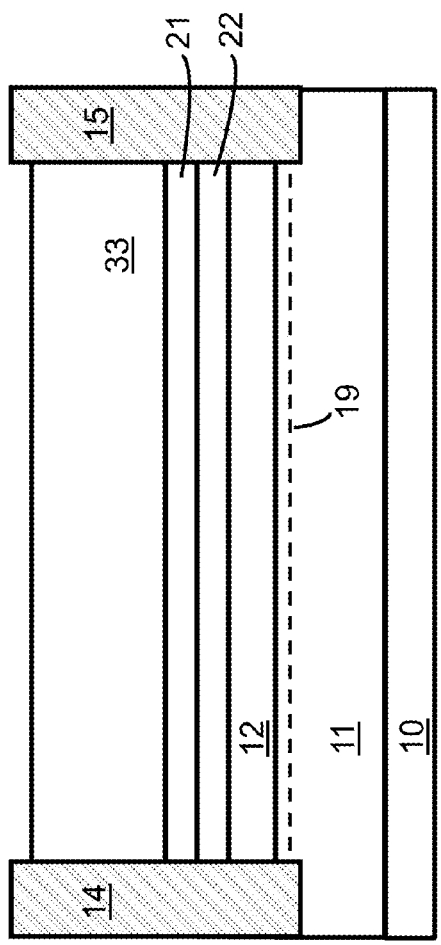

Next, as seen in FIG. 9, the additional dielectric layer 21 and electrode-defining layer 33 are deposited over passivation layer 22, for example by PECVD, sputtering, or evaporation. A recess is then etched through the electrode-defining layer, for example by reactive ion etching RIE or inductively coupled plasma (ICP) etching. The procedure for forming the recess is illustrated in FIGS. 10-16.

Figure 10A:
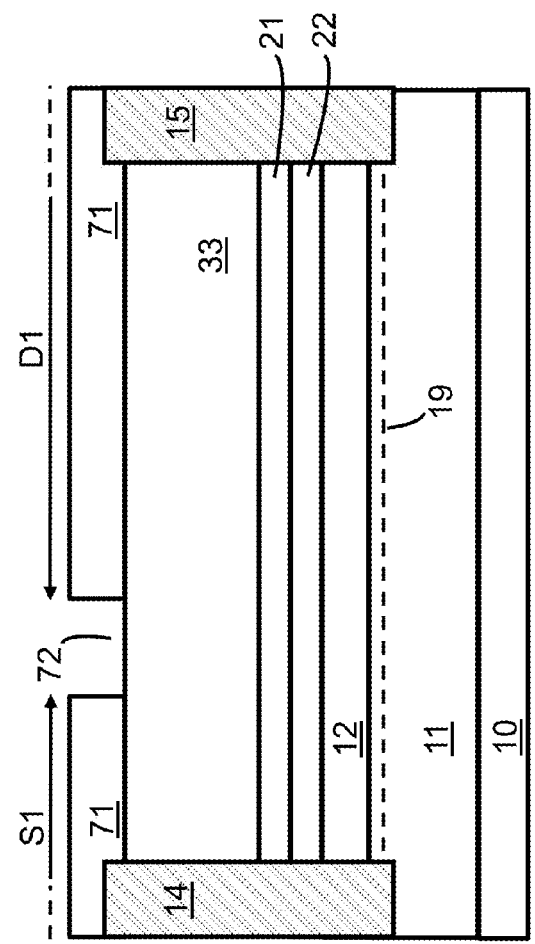
Figure 10B:
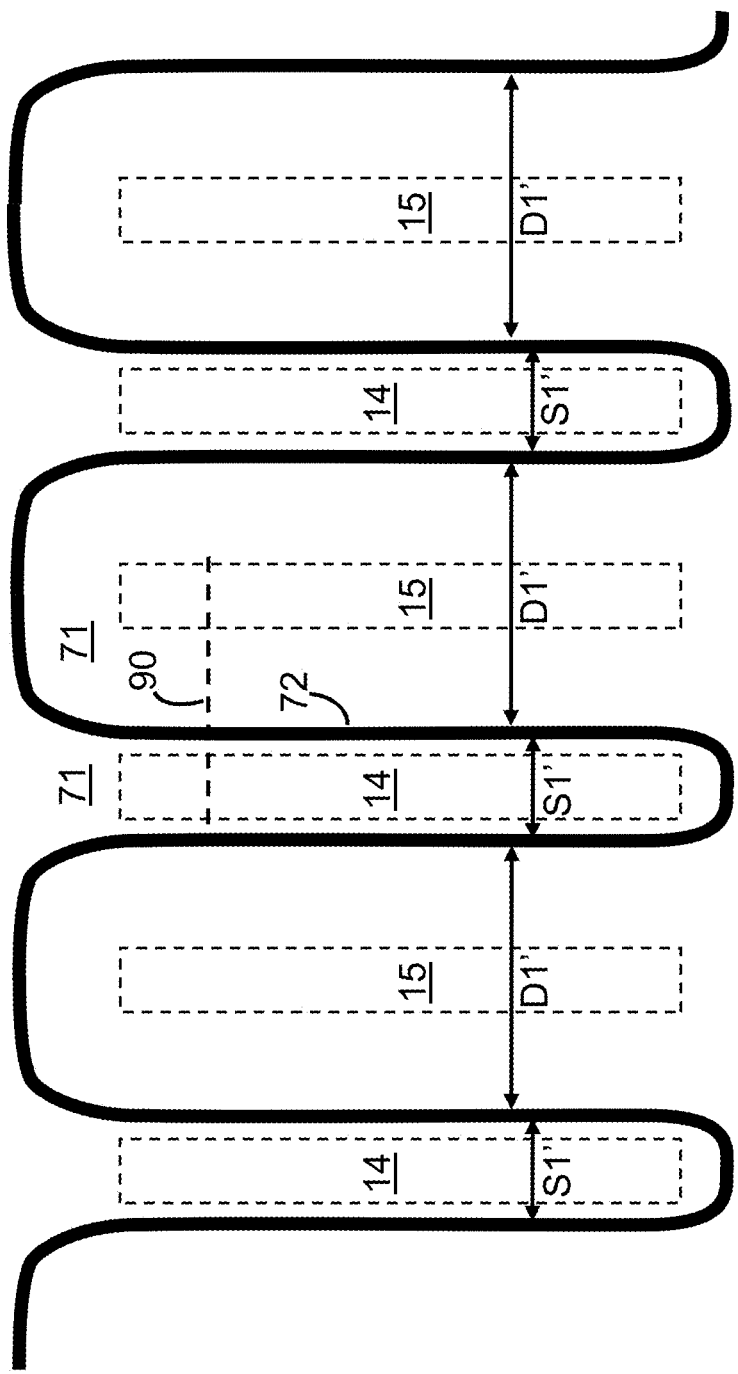

Referring to FIG. 10A, a photoresist masking layer 71 is patterned on the electrode-defining 33 to have an opening 72. Patterning can be performed by standard lithography procedures. FIG. 10B shows a plan view of the device in FIG. 10A, where dashed line 90 indicates the cross section illustrated in FIG. 10A. Source and drain fingers 14 and 15, which are covered by the photoresist masking layer 71, are indicated by rectangles with dashed lines. As seen in FIG. 10B, the opening 72 in the photoresist masking layer 71 is formed in a serpentine-like pattern with regions of width S1' interlaced with regions of width D1', where S1' is approximately the same as width S1 in FIG. 6, and D1' is approximately the same as width D1 in FIG. 6. The portions of the opening 72 that are directly between adjacent source and drain fingers are positioned substantially closer to the source fingers than to the drain fingers; hence, D1' is substantially larger than S2'. Consequently, the volume and surface area of photoresist in the regions of width D1' is substantially larger than that in the regions of width S1'.

Figure 11:
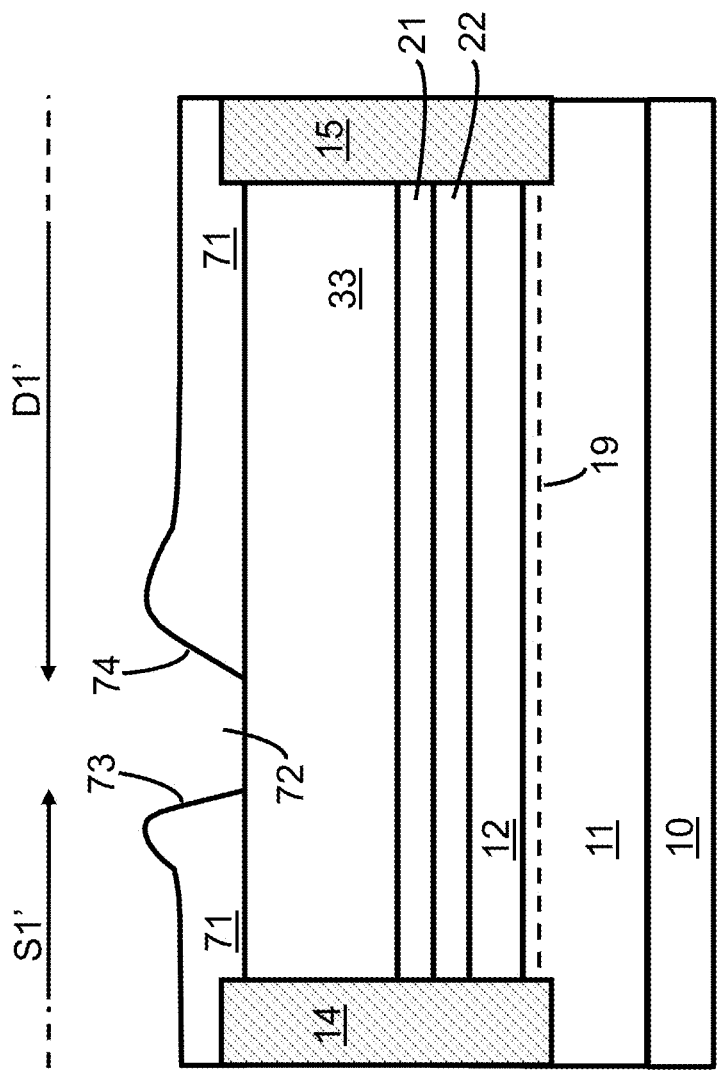

The photoresist in the masking layer 71 is then redistributed, for example by thermally annealing the structure, resulting in the photoresist profile shown in FIG. 11. The anneal is performed at a temperature that does not damage the photoresist layer 71 or any of the underlying layers. As illustrated in FIG. 11, following the redistribution of the photoresist, the photoresist masking layer has slanted sidewalls 73 and 74. The exact slope and resulting profile of sidewalls 73 and 74 depends at least partially on the volume and/or surface area of the portion of photoresist directly adjacent to the sidewall. Because the portion of photoresist adjacent to sidewall 74 (which has a width D1') has a substantially larger volume and surface area than the portion of photoresist adjacent to sidewall 73 (which has a width S1'), the resulting sidewall profile in opening 72 is asymmetric, with sidewall 73 being steeper than sidewall 74. The resulting profile of the photoresist layer 71 and the sidewalls 73 and 74 can be further controlled by varying anneal conditions, such as anneal time, anneal temperature, and the chemistry of the ambient gas in which the anneal is performed. For example, a longer anneal time or a higher temperature may result in a smaller slope in the sidewalls 73 and 74, although the asymmetry illustrated in FIG. 11 and described above still remains.

Figure 12:
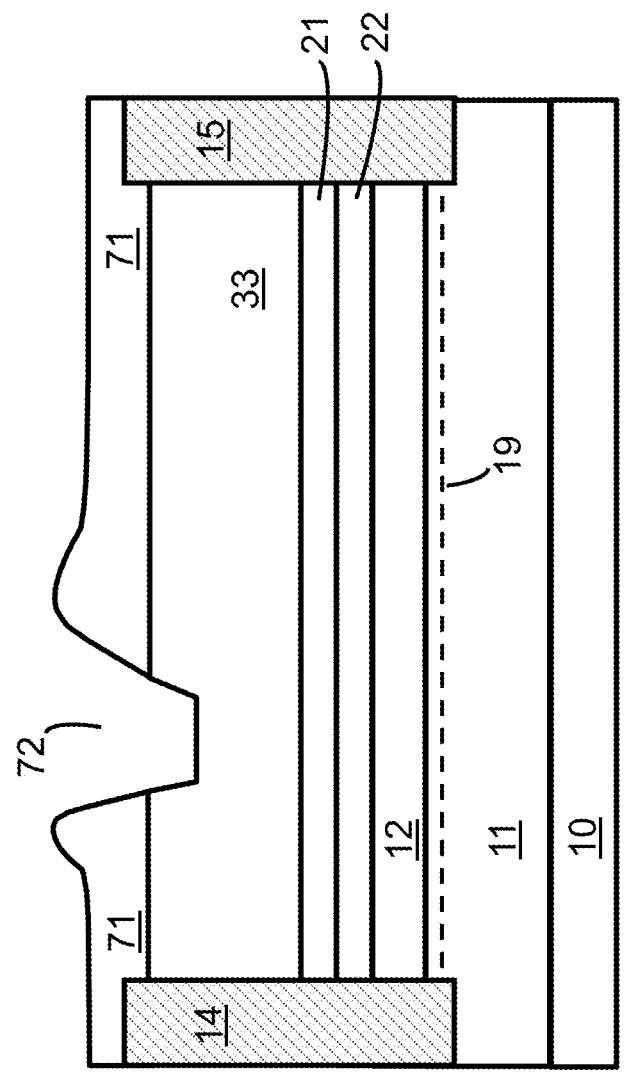

Referring to FIG. 12, the recess in the electrode-defining layer 33 is then partially formed by performing a first etch employing an etch chemistry that etches both the photoresist in layer 71 and the material of the electrode-defining layer 33. For example, if the electrode-defining layer 33 is $SiN_x$, the first etch can be performed by Reactive Ion Etching (RIE) or Inductively Coupled Plasma (ICP) etching using an etch chemistry that includes $O_2$ and $SF_6$. In some implementations, the first etch is a substantially anisotropic etch.

Figure 13:
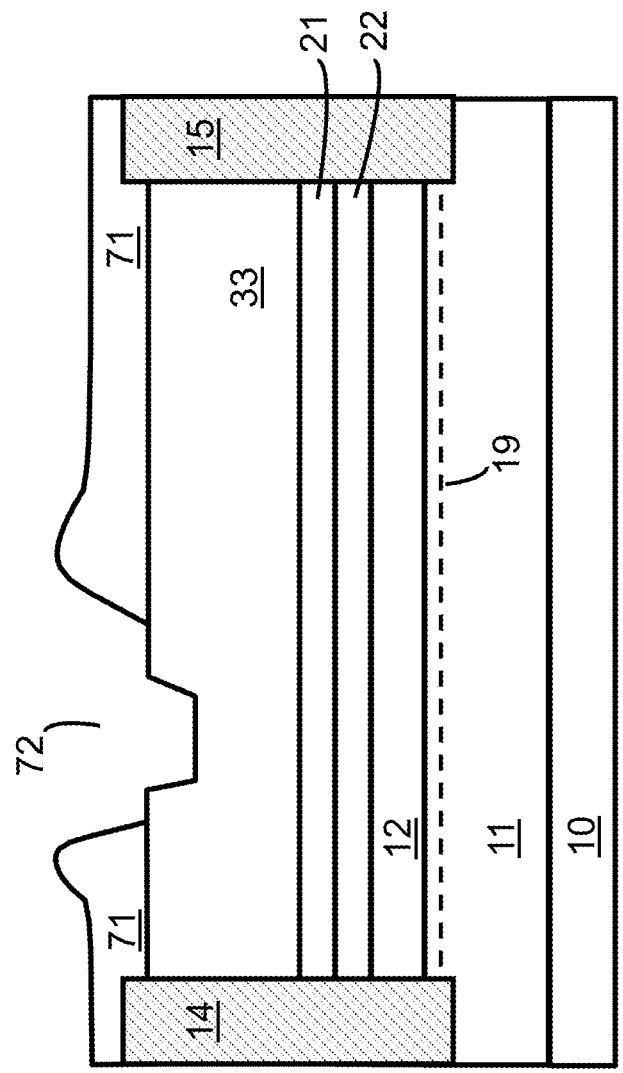
Figure 14:
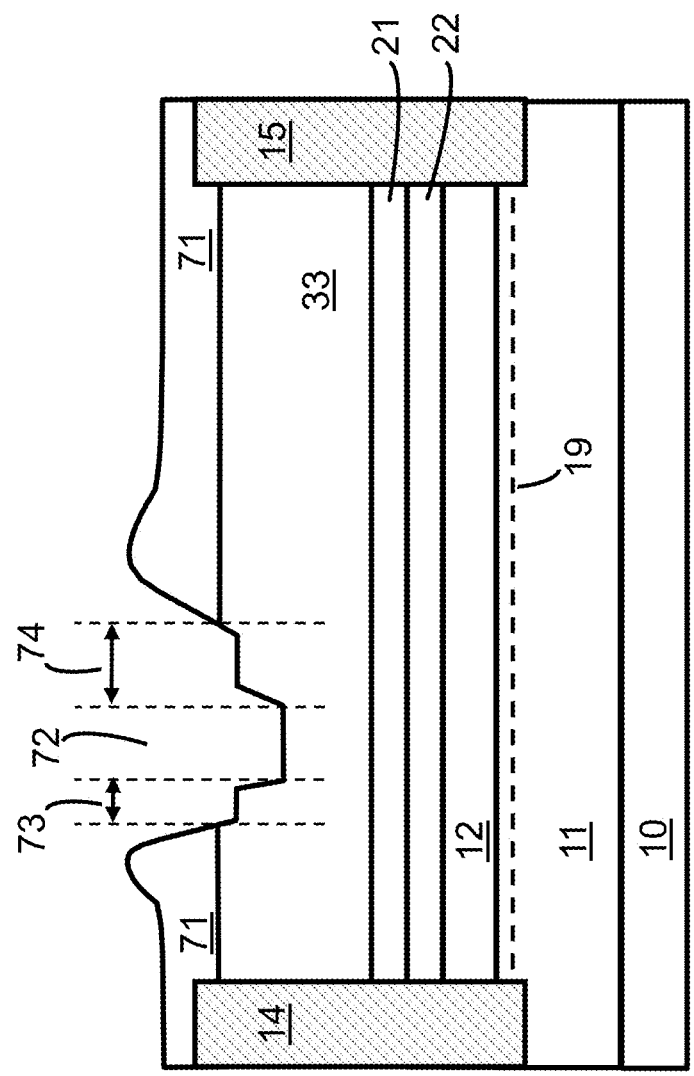
Figure 15:
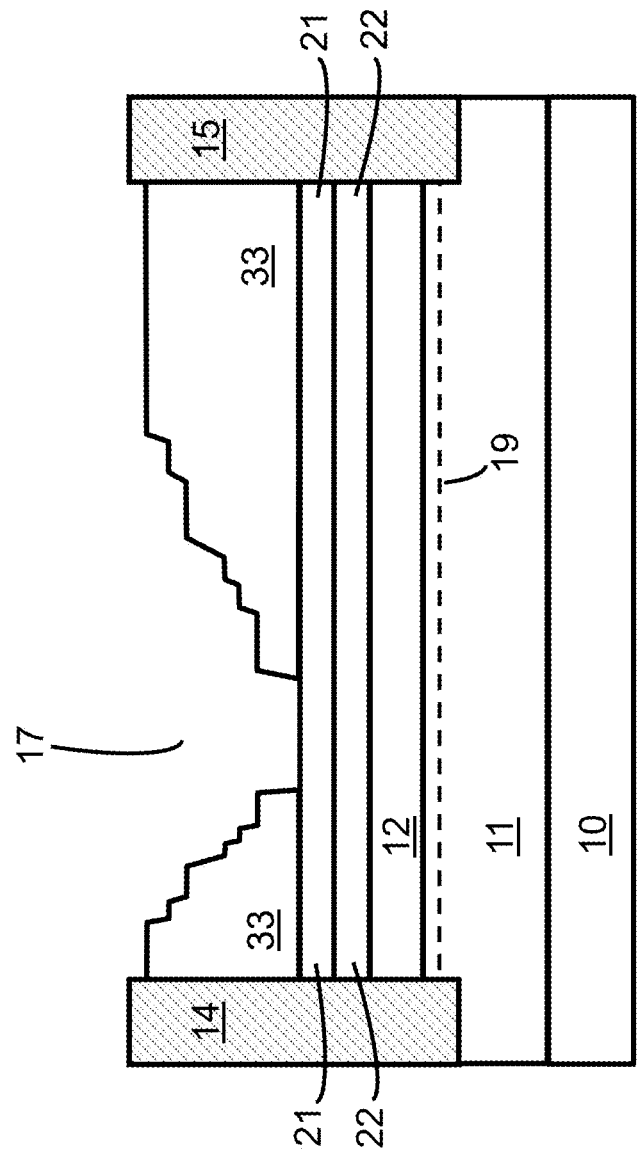

As illustrated in FIG. 13, a second etch is then performed which etches the photoresist masking layer 71 without substantially etching the electrode-defining layer 33, thereby increasing the width of the opening 72. For example, if the electrode-defining layer 33 is $SiN_x$, the second etch can be performed by Reactive Ion Etching (RIE) or Inductively Coupled Plasma (ICP) etching using an etch chemistry that includes only $O_2$. In some implementations, the second etch is a substantially isotropic etch. A third etch is then performed which, like the first etch, utilizes an etch chemistry that etches both the photoresist in layer 71 and the material of the electrode-defining layer 33, resulting in the profile of FIG. 14. As shown in FIG. 14, the horizontal width 74 of the sidewall being formed on the source side of the recess in the electrode-defining layer 33 is greater than the horizontal width 73 of the sidewall being formed on the source side of the recess. The photoresist etch procedure, followed by the procedure for etching both layers 71 and 33, are then repeated multiple times, until the recess 17 extends all the way through the electrode-defining layer 33, resulting in the aperture having a stepped sidewall. The photoresist masking layer 71 is then removed, for example by a solvent clean, resulting in the profile shown in FIG. 15. Additional dielectric layer 21 can be formed of a material that is not substantially etched by the etch procedure used to etch the recess in the electrode-defining layer 33. In such cases, the additional dielectric layer 21 functions as an etch stop layer.

Figure 16:
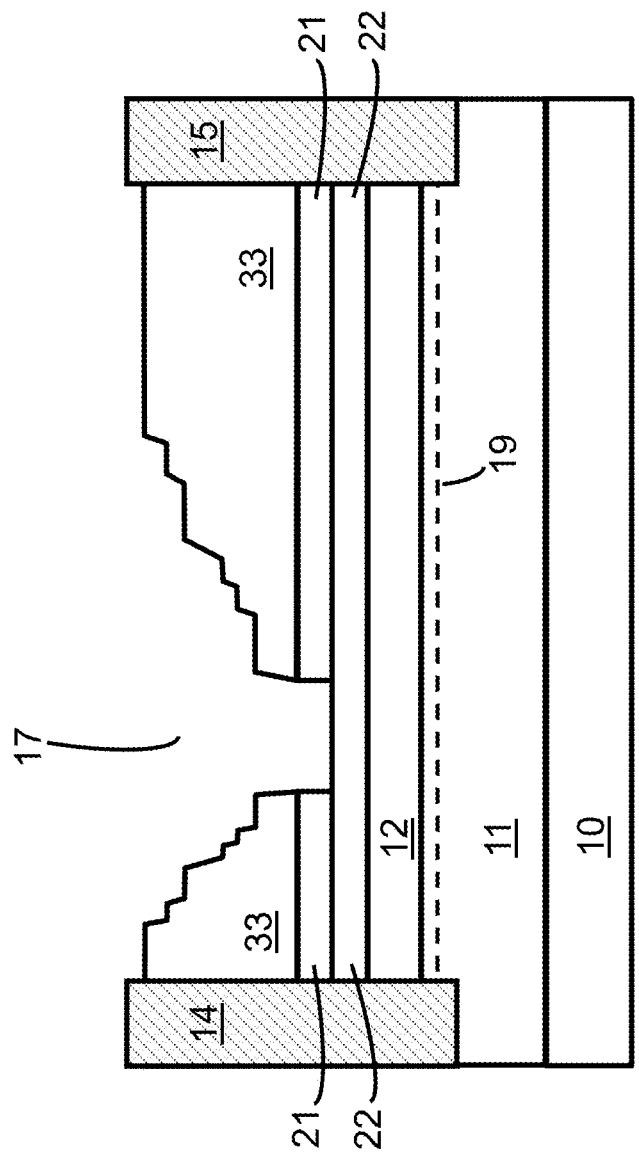

Referring to FIG. 16, the portion of the additional dielectric layer 21 which is adjacent to the recess 17 in electrode-defining layer 33 is then removed, for example by performing an etch which etches the material of the additional dielectric layer 21 but does not etch the material of electrode-defining layer 33 or passivation layer 22. For example, when layers 33 and 22 are both $SiN_x$, and layer 21 is AlN, the portion of layer 21 adjacent to the recess 17 in electrode-defining layer 33 can be chemically etched in a base, such as a photoresist developer. Finally, electrode 59 is deposited conformally in the recess, for example by evaporation, sputtering, or CVD, resulting in the transistor of FIG. 17, which is the same as the transistor of FIG. 4. To form the transistor of FIG. 5, prior to depositing the electrode 59, an additional etch is performed which extends the recess 17 through the passivation layer 22 and into the III-N material structure.

Due to the nature of the etch process described above for forming the recess 17 in electrode-defining layer 33, sidewalls 43 and 46 (labeled in FIG. 17) each have the same number of steps. Steps on opposite sidewalls which are formed simultaneously have substantially the same height. For example, referring to the device of FIG. 17, steps 81 and 91, which were formed simultaneously, have substantially the same height. Similarly, steps 82 and 92 have substantially the same height, steps 83 and 93 have substantially the same height, and steps 84 and 94 have substantially the same height. Furthermore the size and width of each of steps 81-84 is substantially proportional to the size and width of the corresponding step on the opposite sidewall. That is, the ratio of the width of step 81 to the width of step 91, the ratio of the width of step 82 to the width of step 92, the ratio of the width of step 83 to the width of step 93, and the ratio of the width of step 84 to the width of step 94 are all about the same, i.e., substantially the same. In an alternative process in which each of the steps is formed by its own lithography procedure, the above relationship between ratios of widths of corresponding steps typically cannot be maintained due to alignment tolerances (e.g., misalignment) inherent in the lithography procedures.

The devices of FIGS. 4-6 can alternatively be formed using slightly modified versions of the methods described above. For example, the source and drain contacts 14 and 15, respectively, can be formed after formation of the recess 17 in electrode-defining layer 33. Additionally, for the device of FIG. 6, the additional etch step performed to extend the recess 17 into the III-N material structure can include the following steps. Once the recess extends through the passivation layer 22 to the uppermost surface of the III-N materials, and prior to deposition of electrode 59, the structure can be etched using an etch chemistry that etches III-N materials at a higher etch rate than that of the materials used for electrode-defining layer 33 and passivation layer 22. For example, when electrode-defining layer 33 and passivation layer 22 are both $SiN_x$, a $Cl_2$ RIE or ICP etch can be performed, resulting in the recess extending into the III-N material structure.

Figure 17:
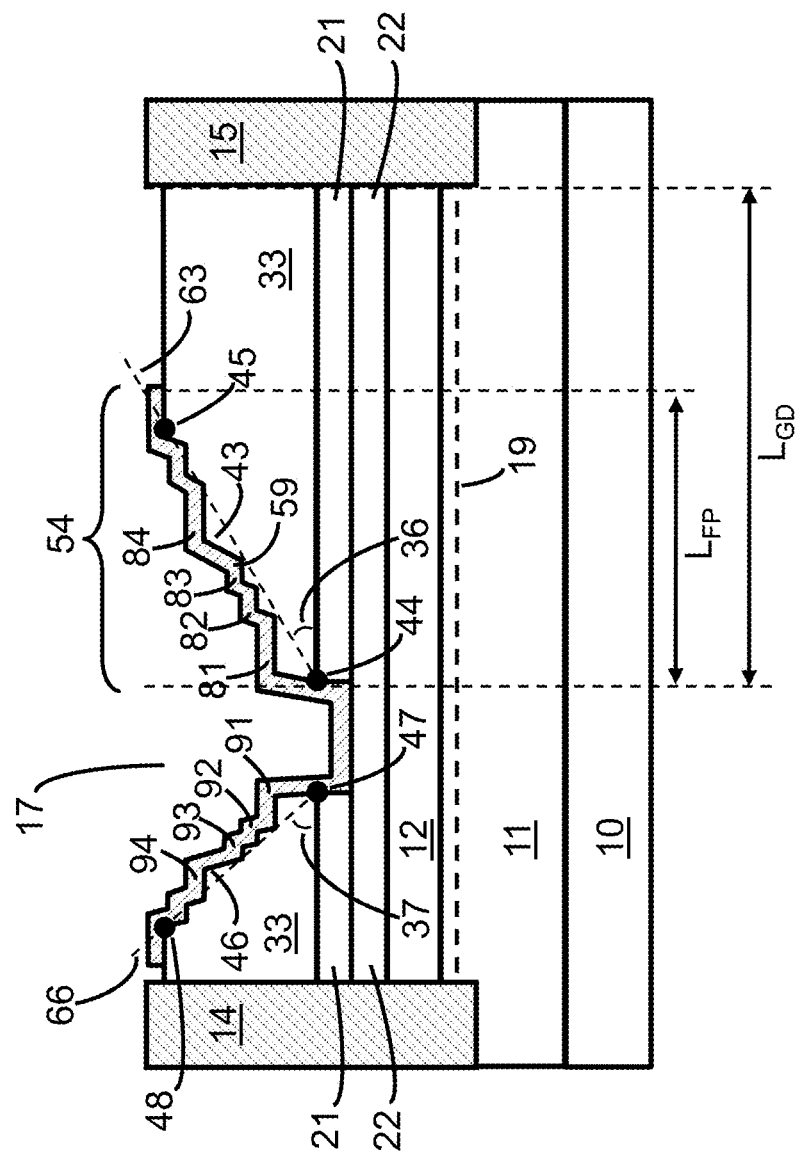

Referring again to the device of FIG. 17, each of the steps 81-84 and 91-94 includes two surfaces (although the steps could each include additional surfaces). One of the surfaces is horizontal (i.e., substantially parallel to the uppermost surface of the III-N material structure), while a second surface is a slanted surface, and is at an angle relative to the uppermost surface of the III-N material structure. The slanted angle of the slanted surface of each step results from the slanted sidewall of the photoresist masking layer 71 used in the fabrication process, as was illustrated in FIG. 11. As previously described, the slant in the sidewalls of the photoresist layer was caused by a redistribution procedure such as a thermal anneal. However, the slanted surface of the steps 81-84 and 91-94 could alternatively be replaced with a substantially vertical surface. If a substantially vertical surface is desired instead of the slanted surface, then the photoresist redistribution procedure can be omitted or altered to change the resulting photoresist profile.

Referring to the sidewall 43 of the recess 17 which defines the shape of the field plate 54 in the device of FIGS. 4 and 17, it has been found that by including a greater number/density of steps without changing any of the other device parameters, higher voltage operation could be reliably achieved. Additionally, if the number/density of steps is increased, it has been found that the device can operate with similar reliability to a device with a lower number/density of steps even if the gate-drain spacing (labeled $L_{GD}$ in FIG. 17) is decreased, which is an unexpected result. Furthermore, if the number/density of steps is increased, it has been found that the device can operate with similar reliability to a device with a lower number/density of steps even if the field plate length (labeled $L_{FP}$ in FIG. 17) is decreased, which is also an unexpected result. For example, devices having a field plate length $L_{FP}$ equal to 11.5 microns (where $L_{FP}$ is defined as the horizontal length from point 44 to the edge of the field plate, as illustrated in FIG. 17) and 8 steps (e.g., a step density greater than 0.4 steps per micron of field plate length), and a gate-drain spacing $L_{GD}$ (where $L_{GD}$ is defined as shown in FIG. 17) equal to 18 microns (e.g., less than 20 microns) were found to reliably support drain-source voltages of at least 600V when the device was in the off-state (i.e., when the gate was biased relative to the source at a voltage lower than the device threshold voltage). In these devices, the off-state drain current per unit gate width at 600V drain-source voltage with the gate biased below the device threshold voltage relative to the source was less than $10^{-8}$ Amps/mm, and the DC on-resistance was less than 16 ohm-millimeters, where the DC on-resistance is defined as the slope of DC current-voltage curve of the device at low drain-source voltages when the gate is biased on. By increasing the thickness of the metals used for the source and drain ohmic contacts, the DC on-resistance could be further reduced to about 12 ohm-millimeters or less. These devices also had very low DC-RF dispersion; the dynamic on-resistance of the device, defined as the on-resistance under switching conditions, was less than 1.1 times (e.g., substantially less than 1.5 times) the DC on-resistance for switching times (i.e., slew rates) of 2 microseconds or less. In comparison, devices formed with field plates having only 3 steps, but having an otherwise similar structure to the devices described above, required a gate-drain spacing $L_{GD}$ of 22 microns (e.g., greater than 20 microns) to reliably support drain-source voltages of at least 600V when the devices was in the off-state. Furthermore, these devices exhibited substantially greater DC and dynamic on-resistances due to the increased gate-drain spacing.

Additionally, the relative sizes of step 81 and the steps closest to step 81 (steps 82-84) have also been found to affect the reliability of the devices during high voltage operation. Specifically, having step 82 and optionally step 83 be substantially smaller than step 81, followed by a larger step (step 84), as shown in FIG. 17, increases the reliability of the devices during high voltage operation. This too is an unexpected result. It is speculated that having such a step size pattern reduces the peak electric field near the drain-side edge of the intrinsic gate (i.e., near point 44) while still maintaining high fields along the remainder of the length of the field plate, thereby allowing for large voltages to be supported with a lower peak electric field.

As stated earlier, III-N layers 11 and 12 have different compositions from one another. The compositions are selected such that the second III-N layer 12 has a larger bandgap than the first III-N layer 11, which helps enable the formation of 2DEG 19. As an example, III-N layer 11 can be GaN and III-N layer 12 can be AlGaN or AlInGaN or BAlInGaN, whereas layer 12 can be n-doped or can contain no significant concentration of doping impurities. In the case that layer 12 is undoped, the induced 2DEG results from the difference in polarization fields between layers 11 and 12.

If III-N layers 11 and 12 are composed of III-N material oriented in a non-polar or semi-polar orientation, then doping all or part of the second semiconductor layer 12 with an n-type impurity may also be required to induce the 2DEG 19. If the III-N layers 11 and 12 are oriented in a polar direction, such as the [0 0 0 1] (i.e., group III-face) orientation, then 2DEG 19 may be induced by the polarization fields without the need for any substantial doping of either of the III-N layers, although the 2DEG sheet charge concentration can be increased by doping all or part of the second III-N layer 12 with an n-type impurity. Increased 2DEG sheet charge concentrations can be beneficial in that they can reduce the diode on-resistance, but they can also lead to lower reverse breakdown voltages. Hence the 2DEG sheet charge concentration preferably is optimized to a suitable value for the application in which the diode is used.

Substrate 10 can be any suitable substrate upon which III-N layers 11 and 12 can be formed, for example silicon carbide (SiC), silicon, sapphire, GaN, AlN, or any other suitable substrate upon which III-N devices can be formed. In some implementations, a III-N buffer layer (not shown) such as AlGaN or AlN is included between substrate 10 and semiconductor layer 11 to minimize material defects in layers 11 and 12.

Figure 18:
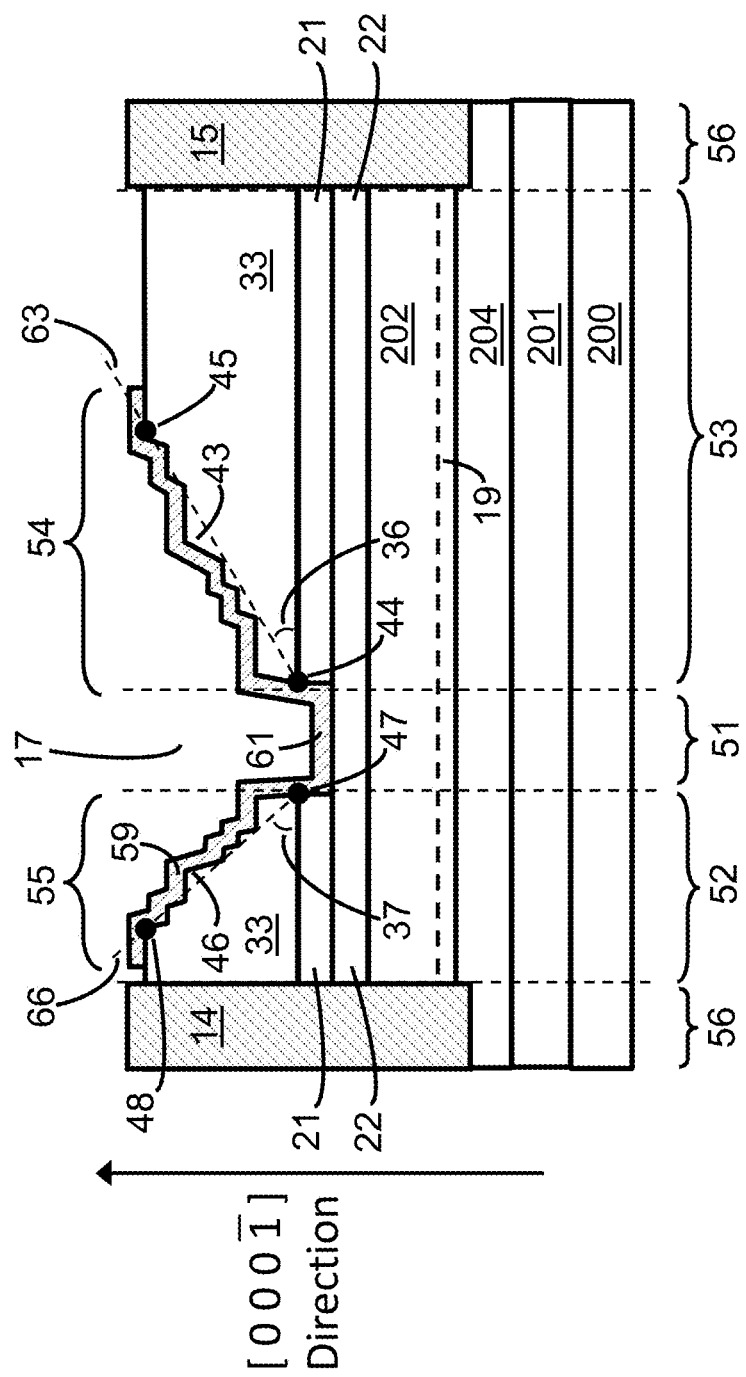
FIG. 18 is a cross-sectional view of another implementation of a III-N HEMT device.

FIG. 18 shows a cross-sectional view of a III-N HEMT transistor similar to the device of FIGS. 4 and 17, but which is fabricated on III-N semiconductor material that is either oriented in the N-polar [0 0 0 1 bar] direction or is a nitrogen-terminated semipolar material. The device includes a substrate 200 which is suitable for growth of N-polar or semipolar III-N materials. Layer 201 is a buffer layer, such as GaN or AlN, which reduces the defect density in the overlying III-N material. In some cases, it is possible to omit layer 201 and grow III-N layer 204 directly on the substrate 200. The composition of III-N layers 204 and 202 are chosen such that a 2DEG 19 can be induced in layer 202 near the interface between layers 202 and 204. For example, layer 204 can be AlGaN or AlInGaN, and layer 202 can be GaN. An additional III-N layer (not shown), such as a layer of AlN, can be included between III-N layers 204 and 202. Another additional III-N layer (not shown) such as AlInGaN, AlInN, or AlGaN, may also be included on an opposite side of III-N layer 202 from III-N layer 204. Electrode-defining layer 33, which again includes a recess, is similar to or the same as that of FIGS. 4 and 17. A gate 59 is formed in the recess. The gate 59 includes an active gate portion 61 in gate region 51 of the device, as well as extending portions 54 and 55, as in FIGS. 4 and 17. The gate 59 is deposited conformally in the recess in the electrode-defining region with extending portion 54 over a sidewall 43 of the recess. Hence, the profile of extending portion 54 is at least partially determined by the profile of the sidewall 43. Source and drain contacts 14 and 15, respectively, are on opposite sides of the gate 59 and form ohmic contacts to the 2DEG channel 19.

As in the HEMT of FIGS. 4 and 17, a passivation layer 22, such as a layer of $SiN_x$, can be included on the uppermost surface of the III-N material structure, and an additional dielectric layer 21, such as a layer of AlN, can be included between the electrode-defining layer 33 and the passivation layer 22. As shown in FIG. 18, the recess in the electrode-defining layer 33 can extend through the entire thickness of the additional dielectric layer 21 but not through the passivation layer 22, such that passivation layer 22 also serves as a gate insulator.

The III-N HEMT of FIG. 18 can be an enhancement-mode (i.e., normally off, with a threshold voltage greater than 0V) or a depletion-mode (i.e., normally on, with a threshold voltage less than 0V) device. Other configurations for the III-N HEMT of FIG. 18 are also possible. For example, in one implementation, the recess in the electrode-defining layer 33 only extends partially through the thickness of the electrode-defining layer 33, such that a portion of the electrode-defining layer 33 is between the III-N materials and gate portion 61 (not shown). In this case, electrode-defining layer 33 can also function as a gate insulator, and it may be possible to omit the passivation layer 22 and/or the additional dielectric layer 21. In another implementation, the recess in the electrode-defining layer 33 additionally extends through the entire thickness of the passivation layer 22, and the gate 59 directly contacts the underlying III-N material (not shown). In yet another implementation, the recess further extends into the III-N materials (not shown), such as through the 2DEG 19, as in the transistor of FIG. 5.

The procedures for forming the device of FIG. 18 are the same as the procedures shown in FIGS. 7-16 for forming the device of FIG. 4, with the exception that the III-N layers formed on the substrate in FIG. 18 have a different crystallographic orientation as compared to the III-N layers formed on the substrate in FIG. 4.

A number of implementations have been described. Nevertheless, it will be understood that various modifications may be made without departing from the spirit and scope of the techniques and devices described herein. Features shown in each of the implementations may be used independently or in combination with one another. Accordingly, other implementations are within the scope of the following claims.

What is claimed is:

1. A III-N transistor, comprising:
   a III-N material structure;
   a source and a drain;
   an electrode-defining layer having a thickness, the electrode-defining layer being over a surface of the III-N material structure, the electrode-defining layer having a recess with a first sidewall proximal to the drain and a second sidewall proximal to the source, the first and second sidewalls each comprising a plurality of steps; and
   an electrode in the recess, the electrode including an extending portion at least partially over the first sidewall; wherein
   the first sidewall forms a first effective angle relative to the surface of the III-N material structure and the second sidewall forms a second effective angle relative to the surface of the III-N material structure, the second effective angle being larger than the first effective angle;
   the electrode includes a gate in a gate region of the transistor;
   the plurality of steps in the first and second sidewalls each include a first step having a first step width directly adjacent to the gate, a second step having a second step width directly adjacent to the first step, and a third step having a third step width directly adjacent to the second step;
   a ratio of the first step width to the second step width in the plurality of steps in the first sidewall is substantially the same as a ratio of the first step width to the second step width in the plurality of steps in the second sidewalk; and
   a sum of the first step width, the second step width, and the third step width in the first sidewall is greater than a sum of the first step width, the second step width, and the third step width in the second sidewall.

2. The transistor of claim 1, wherein the second effective angle is substantially larger than the first effective angle.

3. The transistor of claim 1, wherein the second effective angle is at least 10 degrees larger than the first effective angle.

4. The transistor of claim 1, wherein the III-N material structure comprises a first III-N material layer, a second III-N material layer, and a 2DEG channel induced in the first III-N material layer adjacent to the second III-N material layer as a result of a compositional difference between the first III-N material layer and the second III-N material layer.

5. The transistor of claim 4, wherein the first III-N material layer includes GaN and the second III-N material layer includes AlGaN, AlInN, AlInGaN, or BAlInGaN.

6. The transistor of claim 4, wherein the first III-N material layer and the second III-N material layer are group III-face or [0 0 0 1] oriented or group-III terminated semipolar layers, and the second III-N material layer is between the first III-N material layer and the electrode-defining layer.

7. The transistor of claim 4, wherein the first III-N material layer and the second III-N material layer are N-face or [0 0 0 0–1] oriented or nitrogen-terminated semipolar layers, and the first III-N material layer is between the second III-N material layer and the electrode-defining layer.

8. The transistor of claim 4, wherein the recess extends through the entire thickness of the electrode-defining layer.

9. The transistor of claim 8, wherein the recess extends into the III-N material structure.

10. The transistor of claim 9, wherein the recess extends through the 2DEG channel.

11. The transistor of claim 1, wherein the electrode-defining layer comprises $SiN_x$.

12. The transistor of claim 1, wherein a thickness of the electrode-defining layer is between about 0.1 microns and 5 microns.

13. The transistor of claim 1, further comprising a dielectric passivation layer between the III-N material structure and the electrode-defining layer, the dielectric passivation layer directly contacting a surface of the III-N material adjacent to the electrode.

14. The transistor of claim 13, wherein the dielectric passivation layer comprises $SiN_x$.

15. The transistor of claim 14, wherein the dielectric passivation layer is between the electrode and the III-N material structure, such that the electrode does not directly contact the III-N material structure.

16. The transistor of claim 14, further comprising an additional insulating layer between the dielectric passivation layer and the electrode-defining layer.

17. The transistor of claim 16, wherein the additional insulating layer comprises AlN.

18. The transistor of claim 1, wherein the extending portion of the electrode directly contacts the first sidewall.

19. The transistor of claim 1, wherein a ratio of the first step width to the third step width in the plurality of steps in the first sidewall is substantially the same as a ratio of the first step width to the third step width in the plurality of steps in the second sidewall.

20. A III-N transistor, comprising:
    a III-N material structure;

an electrode-defining layer having a thickness, the electrode-defining layer being over a surface of the III-N material structure, the electrode-defining layer having a recess with a first sidewall proximal to a drain of the III-N transistor and a second sidewall opposite the first sidewall, the first and second sidewalls each comprising a plurality of steps; and an electrode in the recess, the electrode including an extending portion at least partially over the first sidewall; wherein the plurality of steps in the first and second sidewalls each include a first step having a first step width directly adjacent to the gate, a second step having a second step width directly adjacent to the first step, and a third step having a third step width directly adjacent to the second step; and a sum of the first step width, the second step width, and the third step width in the first sidewall is greater than a sum of the first step width, the second step width, and the third step width in the second sidewall.

21. The transistor of claim 20, wherein a ratio of the first step width to the second step width in the plurality of steps in the first sidewall is substantially the same as a ratio of the first step width to the second step width in the plurality of steps in the second sidewall.

* * * * *

UNITED STATES PATENT AND TRADEMARK OFFICE
CERTIFICATE OF CORRECTION

Page 1 of 1

PATENT NO. : 9,520,491 B2
APPLICATION NO. : 14/920059
DATED : December 13, 2016
INVENTOR(S) : Srabanti Chowdhury et al.

It is certified that error appears in the above-identified patent and that said Letters Patent is hereby corrected as shown below:

In the Claims

Column 16, Line 3, in Claim 1: delete "sidewalk;" and insert --sidewall;--, therefor.

Column 16, Line 29, in Claim 7: delete "[0 0 0 0-1]" and insert --[0 0 0-1]--, therefor.

Signed and Sealed this
Twenty-eighth Day of February, 2017

Michelle K. Lee
*Director of the United States Patent and Trademark Office*